United States Patent [19]
Murai et al.

[11] Patent Number: 5,324,969
[45] Date of Patent: Jun. 28, 1994

[54] HIGH-BREAKDOWN VOLTAGE FIELD-EFFECT TRANSISTOR

[75] Inventors: Shigeyuki Murai, Mino; Takayoshi Higashino, Neyagawa; Masao Nishida, Osaka, all of Japan

[73] Assignee: Sanyo Electric Co., Ltd., Moriguchi, Japan

[21] Appl. No.: 930,189

[22] Filed: Aug. 12, 1992

[30] Foreign Application Priority Data

Aug. 20, 1991 [JP] Japan ................................ 3-234116
Oct. 18, 1991 [JP] Japan ................................ 3-299931
Mar. 30, 1992 [JP] Japan ................................ 4-105685

[51] Int. Cl.⁵ .................. H01L 29/80; H01L 29/167; H01L 29/161
[52] U.S. Cl. .................. 257/279; 257/272; 257/280; 257/282; 257/285; 257/286
[58] Field of Search .............. 257/256, 272, 279, 280, 257/281, 282, 285, 286

[56] References Cited

U.S. PATENT DOCUMENTS 4,636,822 1/1987 Codella et al. ................. 257/282

FOREIGN PATENT DOCUMENTS 57-207379 12/1982 Japan ................................ 257/282
63-198375 8/1988 Japan ................................ 257/282

Primary Examiner—Ngan Ngo
Attorney, Agent, or Firm—Thomas R. Morrison

[57] ABSTRACT

A field-effect transistor including a first channel layer, formed in contacting relationship with a gate electrode, and a second channel layer, formed on one side or both sides of the first channel layer in non-contacting relationship with the gate electrode, the carrier concentration in the second channel layer being higher than that in the first channel layer but lower than that in high-impurity concentration active layers forming drain and source regions. The field-effect transistor employs an offset gate configuration in which the gate electrode is formed in contacting relationship with the first channel layer at a position nearer to the high-impurity concentration active layer forming the source region than to the high-impurity concentration active layer forming the drain region. A dummy gate is formed and ion implantation is performed from two different angles using the dummy gate as a mask, thereby efficiently forming the source region, drain region, and second channel layer in a sequence of successive processing steps. By combining the suitably patterned first and second ion shielding layers, the gate to source electrode spacing and the gate to drain electrode spacing are controlled by the accuracy to which the second ion shielding layer can be formed.

13 Claims, 23 Drawing Sheets

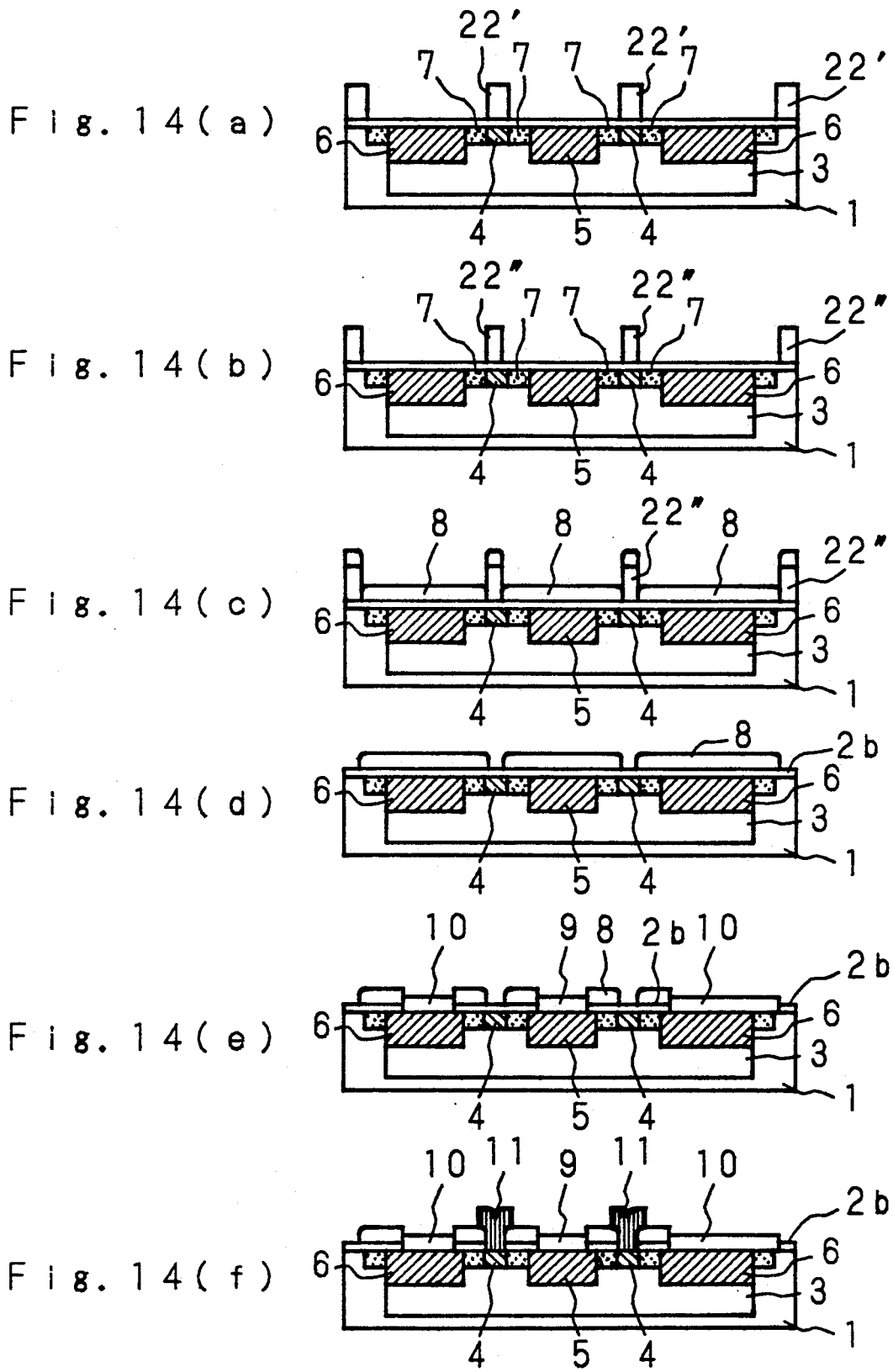

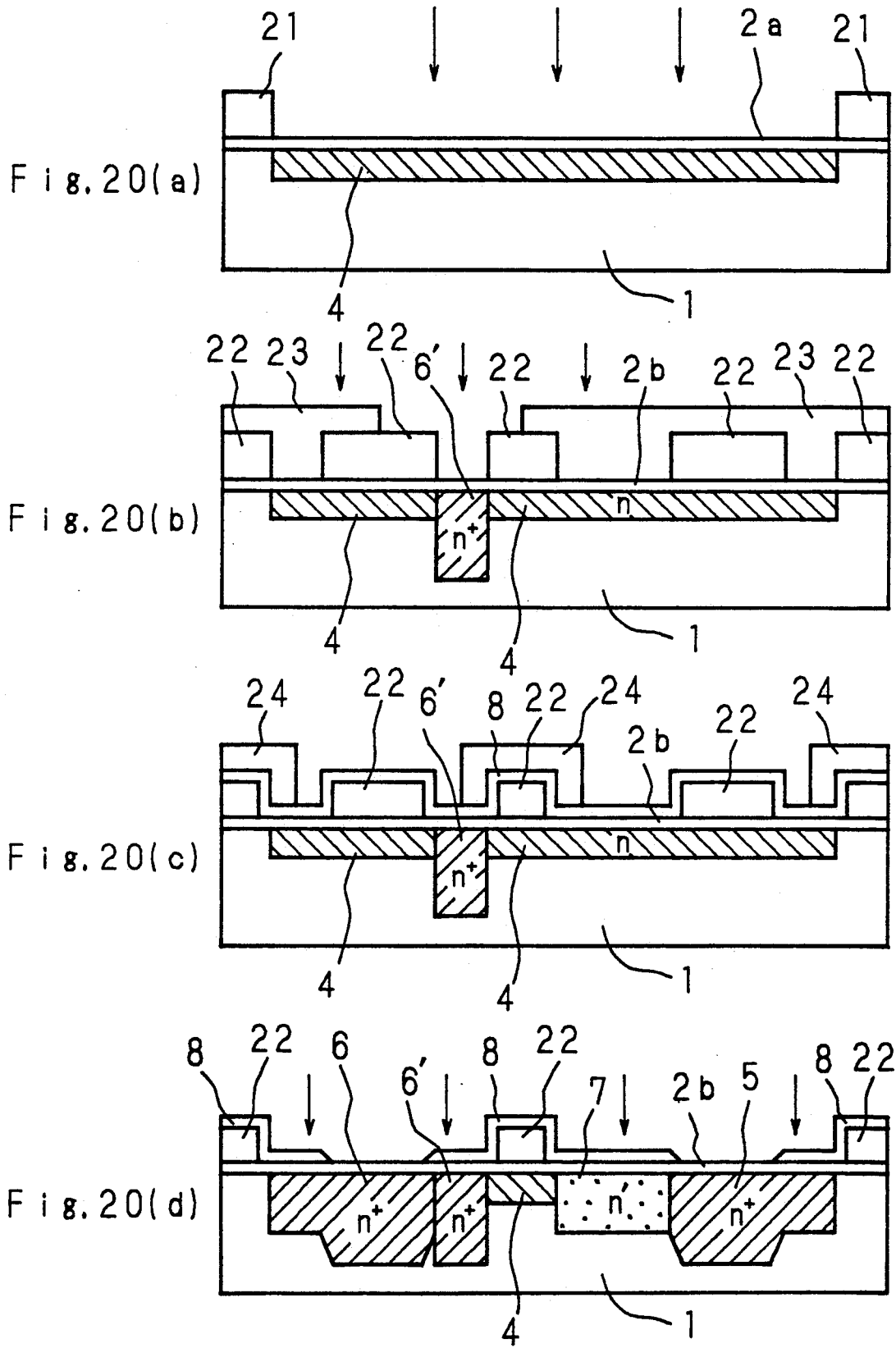

5,324,969

HIGH-BREAKDOWN VOLTAGE FIELD-EFFECT TRANSISTOR

BACKGROUND OF THE INVENTION

1. Field of the Invention

The present invention relates to a metal semiconductor field-effect transistor used for power amplification and a method of fabricating the same.

2. Description of Related Art

Generally, metal semiconductor field-effect transistors (MESFET) for power amplifier use are required to have a large gate-drain breakdown voltage and a small drain conductance for operation under large signals. One previous approach to improving the gate-drain breakdown voltage capability is the so-called offset gate configuration in which the gate electrode is formed nearer to the source, or in other words, by spacing the gate farther away from the drain.

FIG. 1 is a cross sectional view cutting across the source, drain, and gate regions formed alternately in interlaced fashion in a prior art MES field-effect transistor employing the offset gate configuration. In the figure, the reference numeral 1 designates a semiconductive GaAs substrate. In the surface of the GaAs substrate 1, a drain region of n+ conductivity type (a high-impurity concentration active layer forming the drain) 5 and a source region of the same n+ conductivity type (a high-impurity concentration active layer forming the source) 6, separated from each other by a prescribed distance, are formed to a prescribed depth from the surface of the GaAs substrate 1, whereas between the drain region 5 and the source region 6, there is formed a channel layer 4 of n conductivity type to a depth shallower than the drain and source regions 5 and 6.

On the surface of the GaAs substrate, there are formed a drain electrode 9 and a source electrode 10 corresponding respectively to the drain region 5 and the source region 6, between which is formed a gate electrode 11 electrically isolated from adjacent areas by a SiN film 2 and a SiO$_2$ film 8 and connected to the channel layer 4. The gate electrode 11 takes the so-called offset gate configuration so that the gate electrode 11 is formed nearer to the source region 6 than to the drain region 5.

However, in the prior art MES field-effect transistor, the enlarged gate-to-drain spacing inevitably leads to an increase in the drain resistance, which causes such problems as degradation in field-effect transistor characteristics such as mutual conductance and drain current and an inability to effectively reduce the drain conductance.

FIG. 2 is a graph showing the drain voltage (source-drain voltage) Vd-drain current (source-drain current) Id characteristic of the prior art MES field-effect transistor (gate length 0.9 μm, gate width 100 μm), the drain voltage Vd (V) being plotted along the abscissa and the drain current Id (mA) along the ordinate. It can be seen from the graph that, in the region where the drain voltage Vd exceeds 5.0 (V), the drain current Id abruptly increases, which means an increase in the drain conductance; therefore, the static characteristic of the transistor is not satisfactory.

FIG. 3 is a graph showing the gate voltage Vg-drain current Id-mutual conductance gm characteristic of the prior art MES field-effect transistor, the gate voltage Vg (V) being plotted along the abscissa and the drain current Id (mA) and mutual conductance gm (mS) along the ordinate. As is apparent from the graph, the mutual conductance gm is low for the positive region of the gate voltage.

FIG. 4 is a graph showing the gate-drain reverse current-voltage characteristic of the prior art MES field-effect transistor, the gate-drain reverse voltage Vrgd (V) being plotted along the abscissa and the gate-drain reverse current Irgd (A) along the ordinate. As the graph shows, for Vrgd at around 14 (V), the gate-drain reverse current already reaches $10^{-5}$ (A) which is generally considered as the gate-drain breakdown voltage limit.

SUMMARY OF THE INVENTION

It is an object of the present invention to provide a field-effect transistor that can achieve an improvement in the gate-drain breakdown voltage characteristic and a reduction in the drain conductance, and a method of fabricating such a transistor.

Another object of the invention is to provide a method of fabricating a field-effect transistor whereby the source, drain, channel and other regions can be formed in an efficient manner achieving a significant improvement in the production efficiency.

A further object of the invention is to provide a method of fabricating a field-effect transistor wherein the gate to electrode spacing source and the gate to drain electrode spacing can be easily controlled.

In the field-effect transistor of the invention, on one side or both sides of a first channel layer formed in contacting relationship with a gate electrode, there is formed a second channel layer in non-contacting relationship with the gate electrode, the carrier concentration in the second channel layer being higher than that in the first channel layer but lower than that in high-impurity concentration active layers forming drain and source regions. The field-effect transistor employs an offset gate configuration in which the gate electrode is formed contacting the first channel layer at a position nearer to the high-impurity concentration active layer forming the source region but farther away from the high-impurity concentration active layer forming the drain region. The presence of the second channel layer serves to reduce the resistance between the gate electrode and the high-impurity concentration active layer forming the drain region, thus increasing the mutual conductance of the field-effect transistor while reducing the drain conductance. And, the non-contacting relationship between the gate electrode and the second channel layer serves to improve the gate-drain breakdown voltage characteristic. The gate-drain breakdown voltage characteristic can be further improved by setting the thickness W of the second channel to satisfy the following expression.

$$W \leq (\epsilon_o \cdot \epsilon_s \cdot E_a)/(q \cdot N)$$

where
$\epsilon_0$: Permittivity of free space
$\epsilon_s$: Relative permittivity of the second channel layer
$E_a$: Critical field strength of the second channel layer
q: Unit charge amount of electron
N: Carrier concentration in the second channel layer In the field-effect transistor fabrication method of the invention, a dummy gate is formed and ion implantation is performed from two different angles using the dummy gate as a mask, which allows the source region, drain region, and second channel layer to be efficiently formed in a sequence of successive processing steps.

Furthermore, in the field-effect transistor fabrication method of the invention, by combining the suitably patterned first and second ion shielding layers, it is possible to control the gate to electrode spacing source and the gate to drain electrode spacing by the accuracy to which the second ion shielding layer can be formed.

The above and further objects and features of the invention will more fully be apparent from the following detailed description with accompanying drawings.

BRIEF DESCRIPTION OF THE DRAWINGS

FIGS. 13(a) to 13(f) and 14(a) to 14(f) are cross sectional views illustrating a fabrication process sequence for the field-effect transistor of FIG. 12;

FIGS. 20(a) to 20(d) and FIGS. 21(a) to 21(d) are cross sectional views illustrating a fabrication process sequence according to another embodiment of the field-effect transistor fabrication method of the present invention.

DESCRIPTION OF THE PREFERRED EMBODIMENTS

The preferred embodiments of the present invention will now be described with reference to the accompanying drawings.

Embodiment 1

Figure 5A:
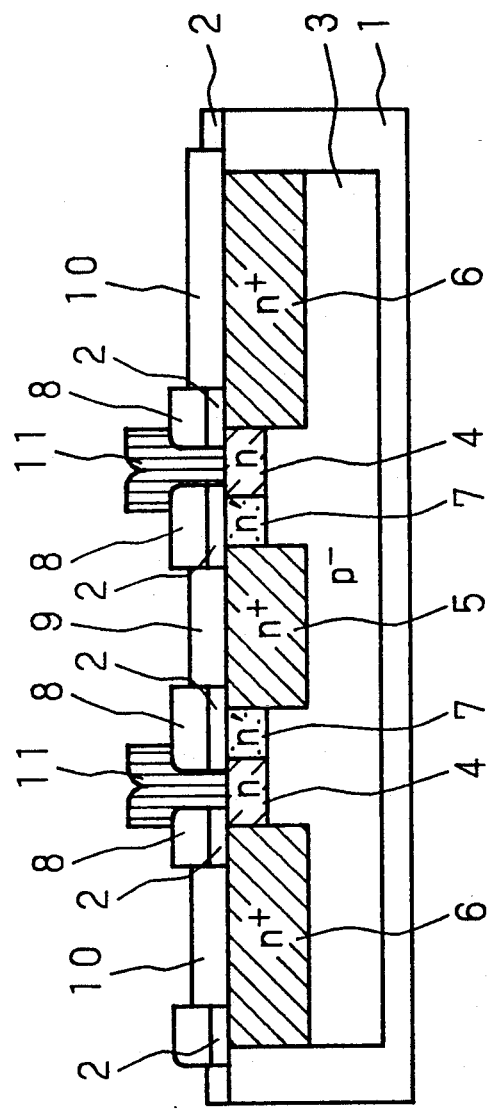
FIG. 5a is a cross sectional view of a field-effect transistor according to one embodiment of the present invention.

FIG. 5a is a cross sectional view showing the structure of a MES field-effect transistor (MESFET) embodying the present invention. In the figure, the reference numeral 1 designates a semiconductive GaAs substrate. In the surface of the GaAs substrate 1, a drain region of n+ conductivity type (a high-impurity concentration active layer forming the drain) 5 and a source region of the same n+ conductivity type (a high-impurity concentration active layer forming the source) 6, separated from each other by a prescribed distance, are formed to a prescribed depth from the surface of the GaAs substrate 1 and within a buffer layer 3 of p− conductivity type, whereas between the drain region 5 and the source region 6, there is formed a channel layer 4 of n conductivity type extending from one side of the source region 6 toward the drain region 5 over a distance covering more than half of the in-between region, while on the other hand, in the region extending from the channel layer 4 to the drain region 5, a channel layer 7 of n' conductivity type is formed. Both channel layers 4 and 7 are formed to the same depth from the surface of the GaAs substrate 1.

The carrier concentration in the channel layer 7 is chosen to be higher than that in the channel layer 4 but lower than that in the drain and source regions 5 and 6. The thickness W of the channel layer 7 is so determined as to satisfy the following expression.

$$W \leq (\epsilon_o \cdot \epsilon_s \cdot E_a)/(q \cdot N)$$

where
$\epsilon_o$: Permittivity of free space
$\epsilon_s$: Relative permittivity of channel layer 7
$E_a$: Critical field strength of channel layer 7
$q$: Unit charge amount of electron
$N$: Carrier concentration in channel layer 7

On the surface of the GaAs substrate 1, there are formed a drain electrode 9, a source electrode 10, and a gate electrode 11 corresponding respectively to the drain region 5, the source region 6, and the channel layer 4, each electrode contacting the corresponding region or layer. The gate electrode 11 is isolated from the drain electrode 9 and the source electrode 10 by an insulating film consisting of a SiN film 2 and a SiO2 film 8 successively formed one on top of the other.

Figure 1:
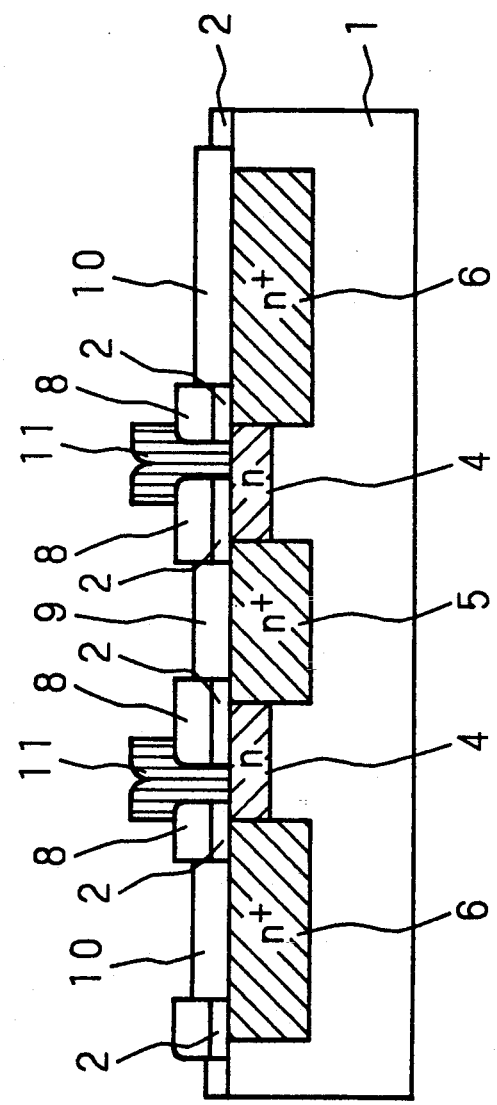
FIG. 1 is a cross sectional view of a prior art field-effect transistor.
Figure 2:
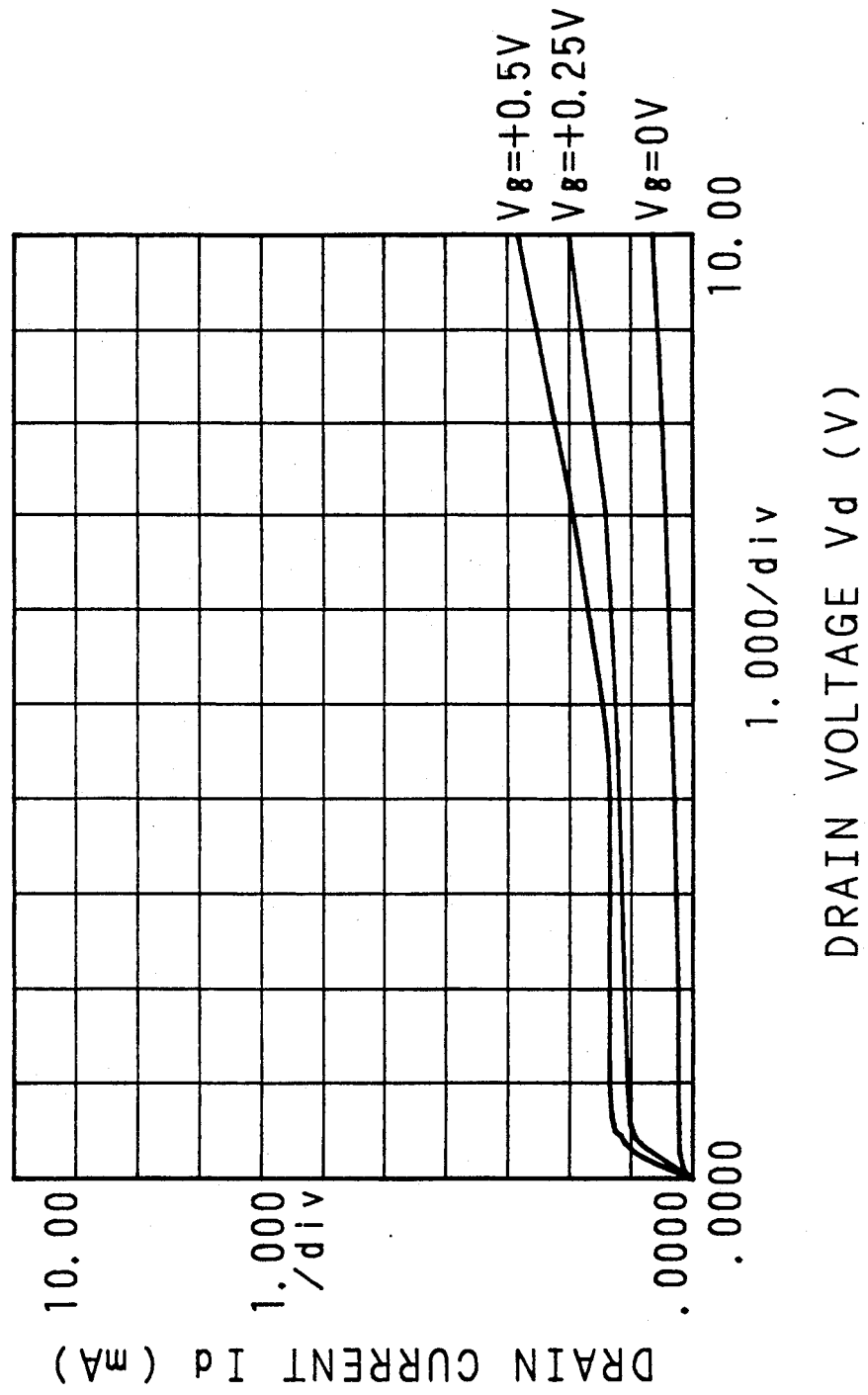
FIG. 2 is a graph showing the relationship of drain voltage to drain current for the prior art field-effect transistor.
Figure 6:
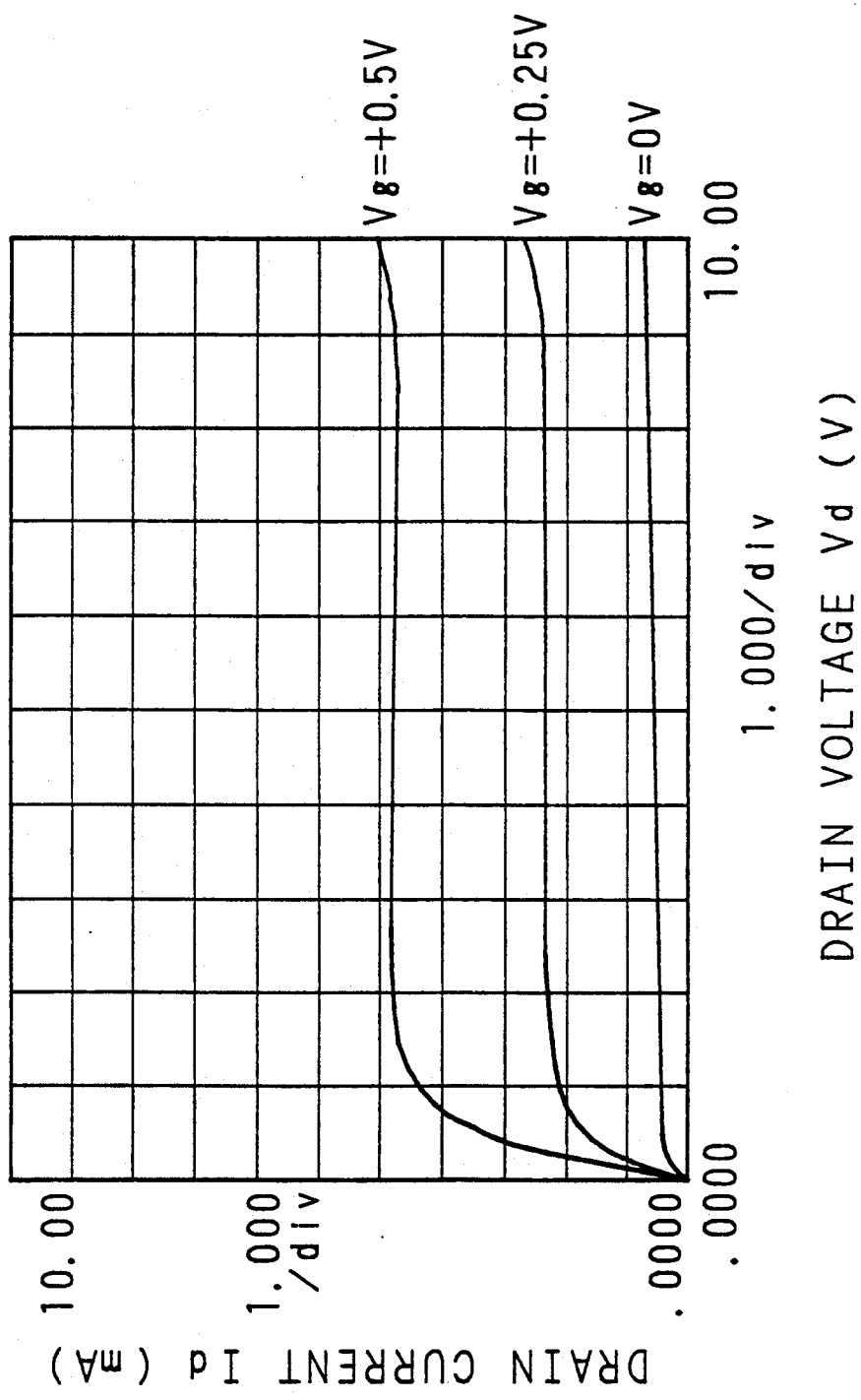
FIG. 6 is a graph showing the relationship of drain voltage to drain current for the field-effect transistor of FIG. 5.

FIG. 6 is a graph showing the relationship of drain voltage (source-drain voltage) Vd to drain current (source-drain current) Id for the field-effect transistor (gate length 0.9 μm, gate width 100 μm) embodying the invention as described above. The drain voltage Vd (V) is plotted along the abscissa and the drain current Id (mA) along the ordinate. From the comparison of this graph with the characteristic of the prior art field-effect transistor shown in FIG. 2, it can be seen that while in the prior art field-effect transistor the drain current Id abruptly changes in the region exceeding 5.00 (V), the drain current Id in the field-effect transistor of the invention almost levels off over the range from 1.0 to 10.00 (V), which means that the drain conductance is small, achieving a significant improvement in the static characteristic of the transistor.

Figure 3:
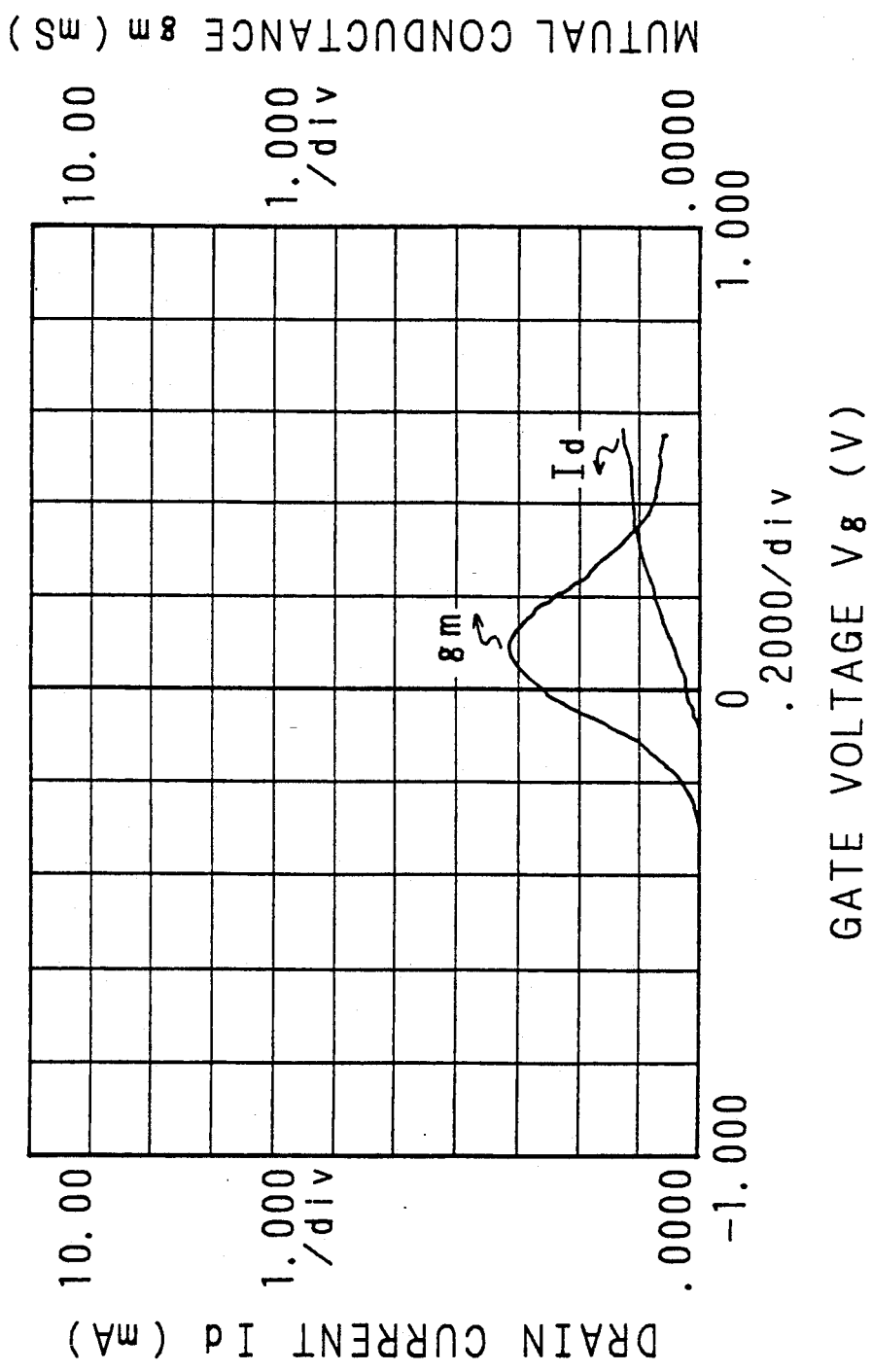
FIG. 3 is a graph showing the relationship of gate voltage to drain current and mutual conductance for the prior art field-effect transistor.
Figure 7:
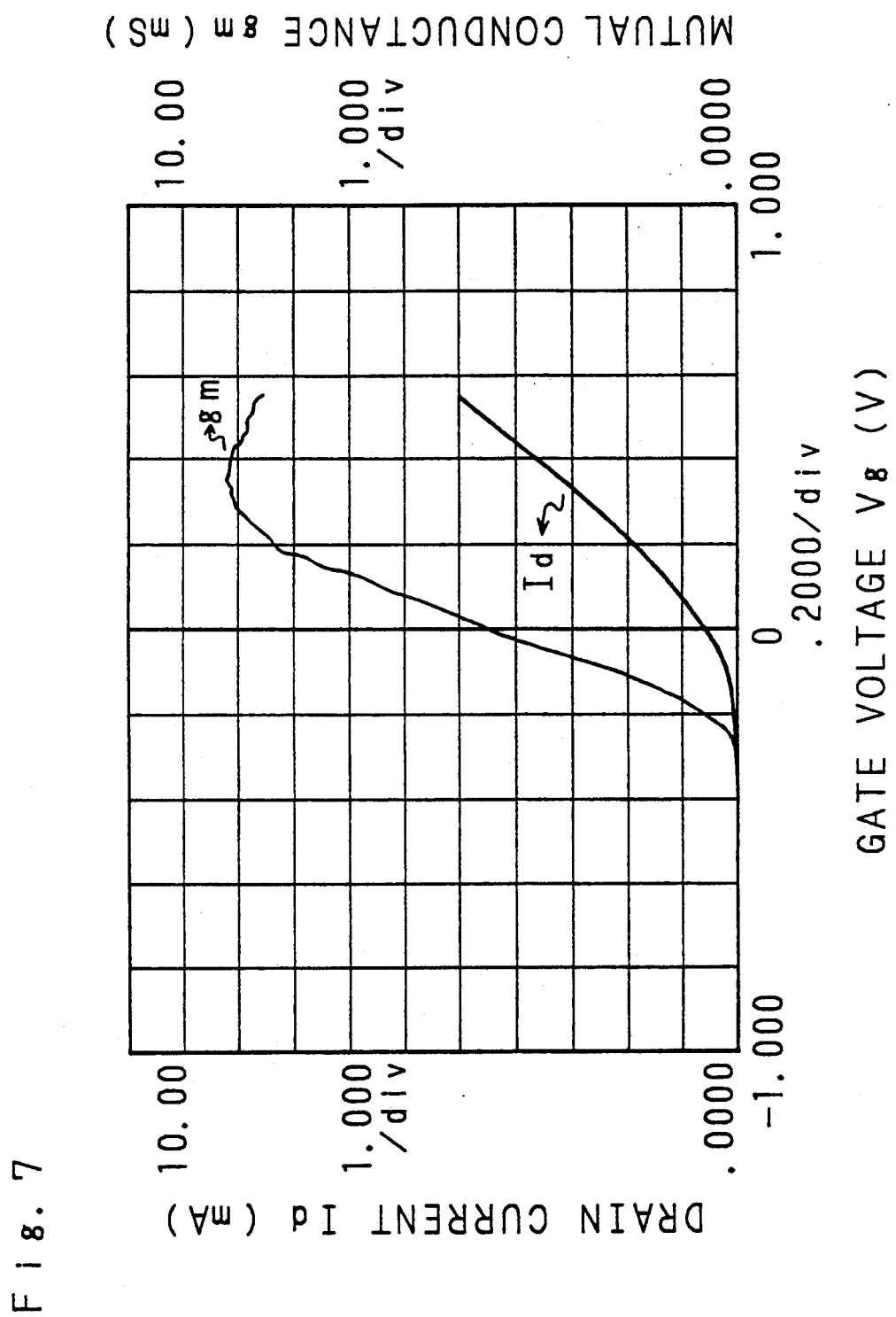
FIG. 7 is a graph showing the relationship of gate voltage to drain current and mutual conductance for the field-effect transistor of FIG. 5.

FIG. 7 is a graph showing the relationship of gate voltage Vg to drain current Id and mutual conductance gm for the field-effect transistor embodying the present invention. The gate voltage Vg (V) is plotted along the abscissa and the drain current Id (mA) and mutual conductance gm (mS) along the ordinate. From the comparison of this graph with the characteristic of the prior art field-effect transistor shown in FIG. 3, it can be seen that in the field-effect transistor of the invention an increase both in the drain current Id and in the mutual conductance gm is observed in the positive gate voltage region as well, thus achieving an improvement in the characteristic of the transistor.

Figure 4:
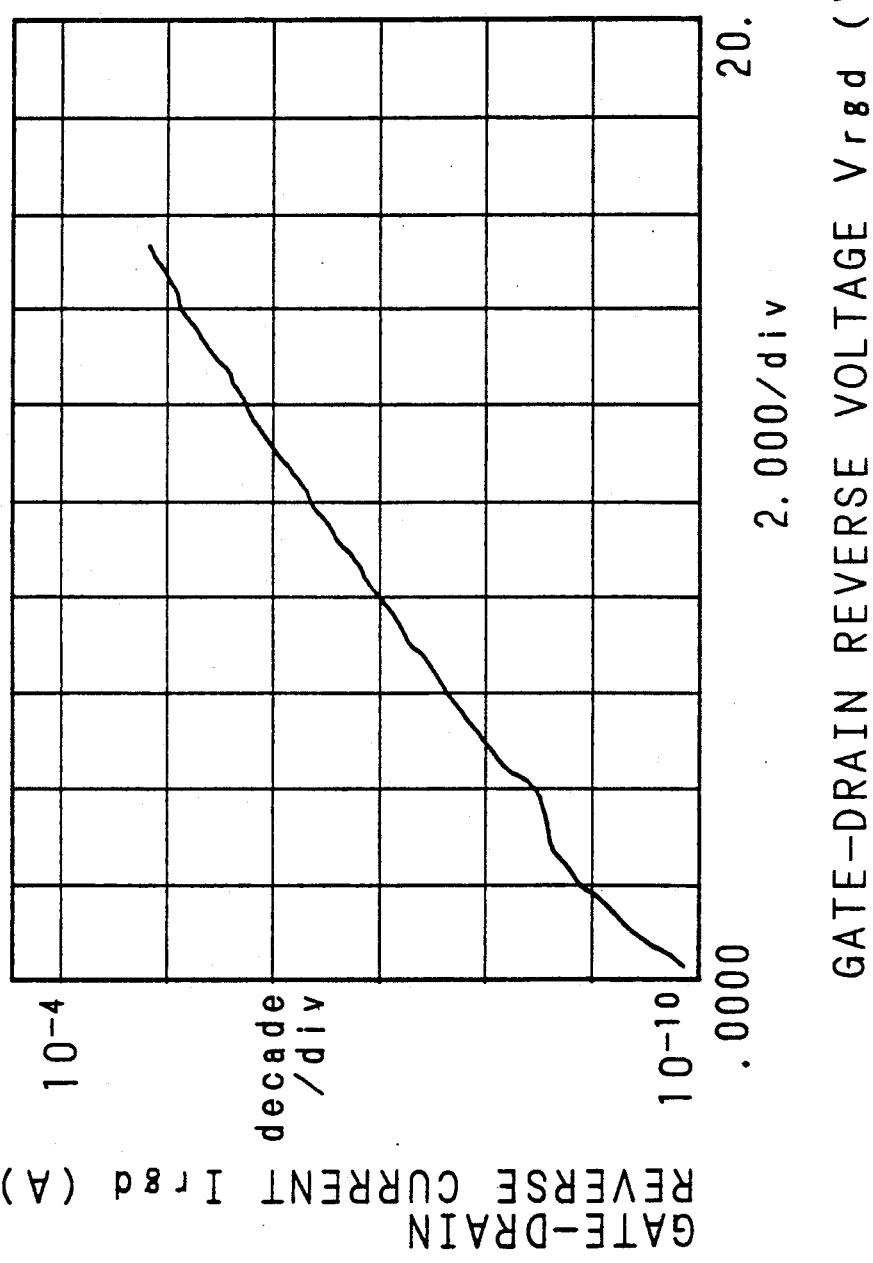
FIG. 4 is a graph showing the gate-drain reverse current-voltage characteristic of the prior art field-effect transistor.
Figure 8:
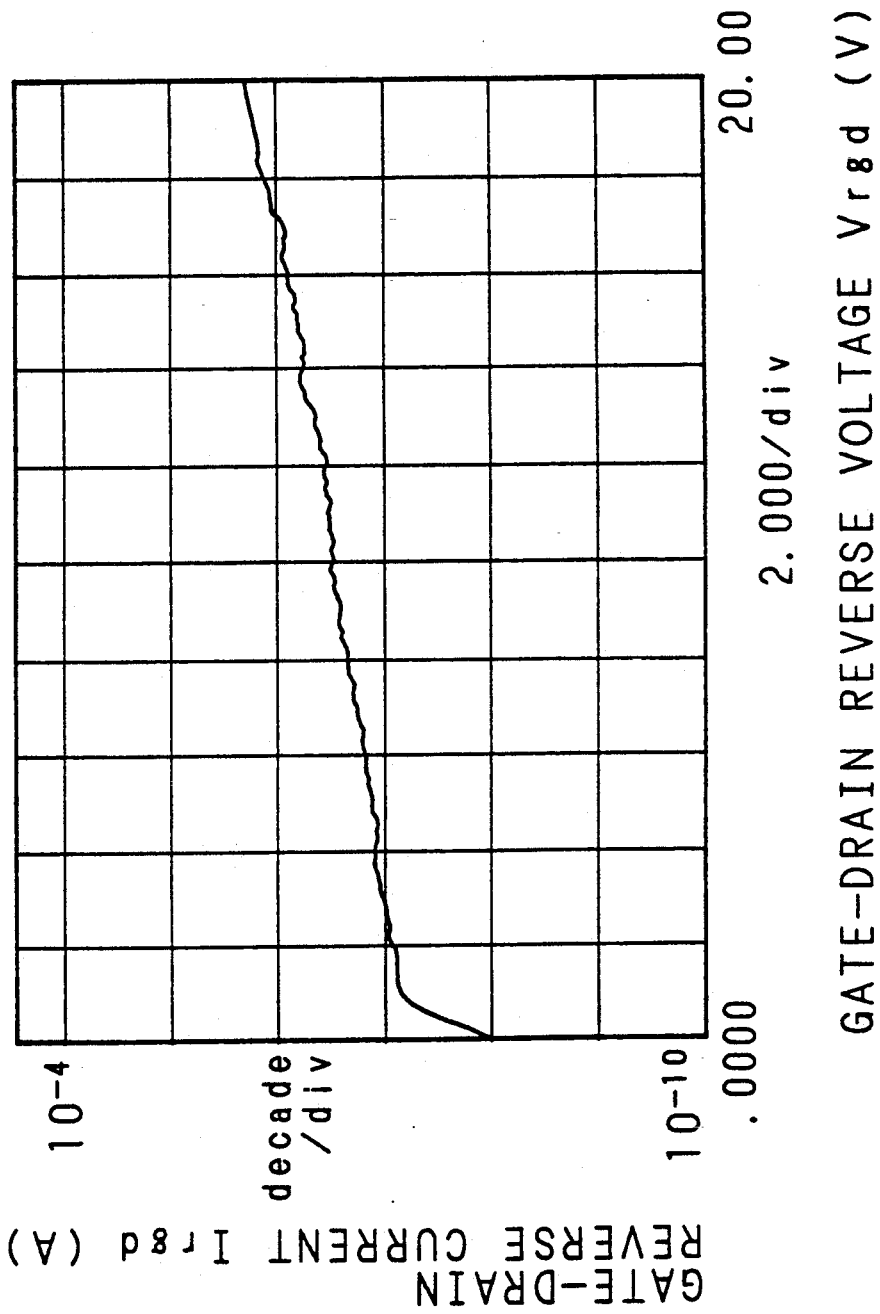
FIG. 8 is a graph showing the gate-drain reverse current-voltage characteristic of the field-effect transistor of FIG. 5.

FIG. 8 is a graph showing the gate-drain reverse current-voltage characteristic of the field-effect transistor embodying the present invention. The gate-drain reverse voltage Vrgd (V) is plotted along the abscissa and the gate-drain reverse current Irgd (A) along the ordinate. When this graph is compared with the graph shown in FIG. 4, an improvement in the characteristic can be seen in the field-effect transistor of the present invention, as contrasted with the prior art field-effect transistor, in that a sufficient margin is provided for Vrgd before $10^{-5}$ (A) is reached which is generally considered as a measure of the gate-drain reverse current value.

Figure 9:
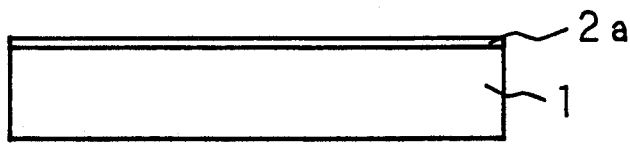
FIGS. 9(a) to 9(g) and 10(a) to 10(f) are cross sectional views illustrating a fabrication process sequence for the field-effect transistor of FIG. 5.
Figure 9:
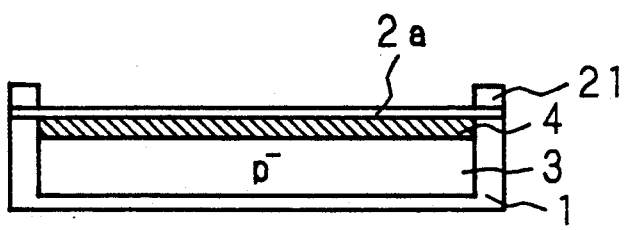
Figure 9:
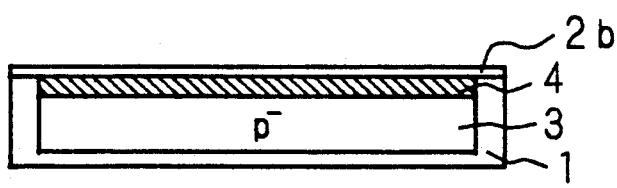
Figure 9:
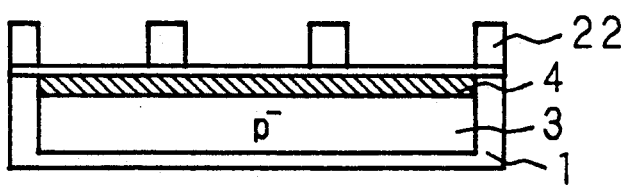
Figure 9:
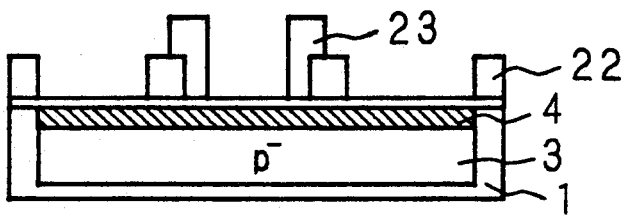
Figure 9:
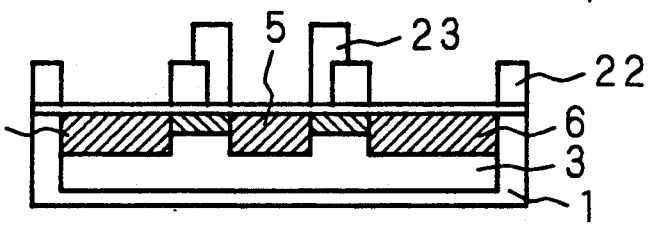
Figure 9:
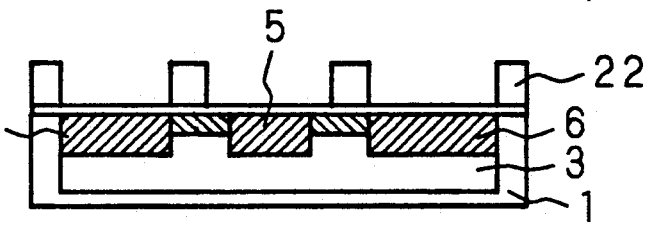
Figure 10:
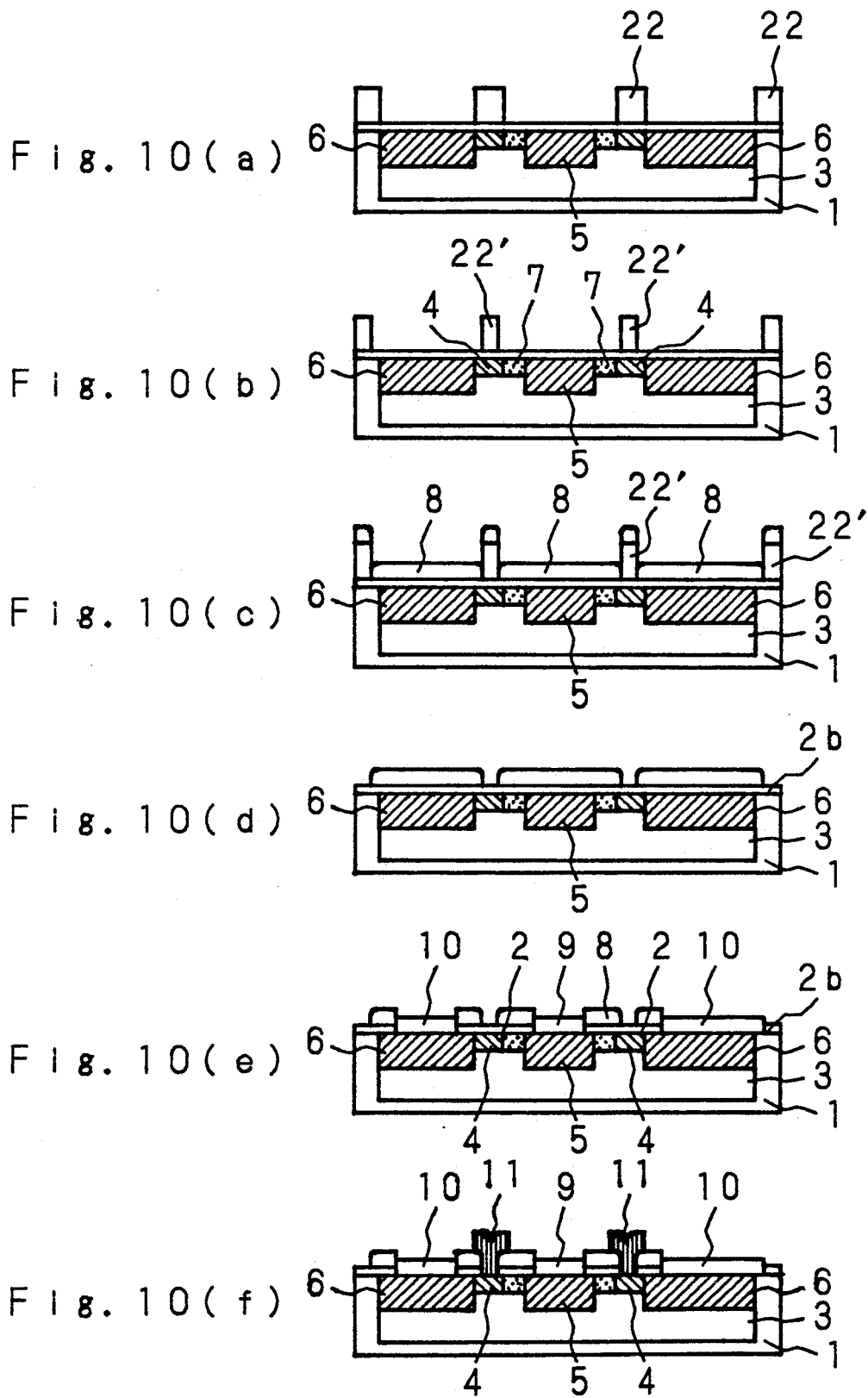

A method of fabricating a field-effect transistor having the above structure will now be described with reference to FIGS. 9 and 10 illustrating a fabrication process sequence for the same.

As shown in FIG. 9(a), a SiN film 2a of 150 Å thickness through which to implant ions is formed over the surface of a semiconductive GaAs substrate 1. After a resist 21 is patterned, as shown in FIG. 9(b), a dopant (Mg) is introduced into a prescribed depth below the surface of the GaAs substrate 1 by ion implantation to form a buffer layer 3 of p$^-$ conductivity type, which is followed by the ion implantation of a dopant (Si) through the SiN film 2a into the GaAs substrate 1 to a prescribed and uniform depth from the surface thereof to form a channel layer 4 of n conductivity type, the depth being controlled to be shallower than that of the buffer layer 3. Implantation of the dopant Mg for forming the buffer layer 3 is performed at an implantation energy of 170 keV with an implant dose of $1 \times 10^{12}/cm^2$, whereas implantation of the dopant Si for forming the channel layer 4 is performed at an implantation energy of 100 keV with an implant dose of $2 \times 10^{12}/cm^2$.

After removing the resist 21 and the SiN film 2a, as shown in FIG. 9(c), a SiN film 2b of 500 Å thickness that can withstand annealing is formed again over the surface of the GaAs substrate 1. Next, a resist 22 applied over the SiN film 2b for forming a dummy gate is patterned as shown in FIG. 9(d). Furthermore, as shown in FIG. 9(e), a resist 23 having a different wavelength sensitivity from that of the resist 22 is patterned for the formation of an offset pattern. Using the resists 22 and 23 as a mask, a dopant (Si) is introduced into a prescribed depth below the surface of the GaAs substrate 1 by ion implantation, thereby forming an ion-implanted drain region of n$^+$ conductivity type (a high-impurity concentration active layer forming the drain) 5 and a source region of the same n$^+$ conductivity type (a high-impurity concentration active layer forming the source) 6, as shown in FIG. 9(f). The spacing between the drain region 5 and the source region 6 is about 4.1 μm. Implantation of the dopant Si for the formation of the drain and source regions 5 and 6 is performed at an implantation energy of 90 keV with an implant dose of $5 \times 10^{13}/cm^2$.

Figure 5B:
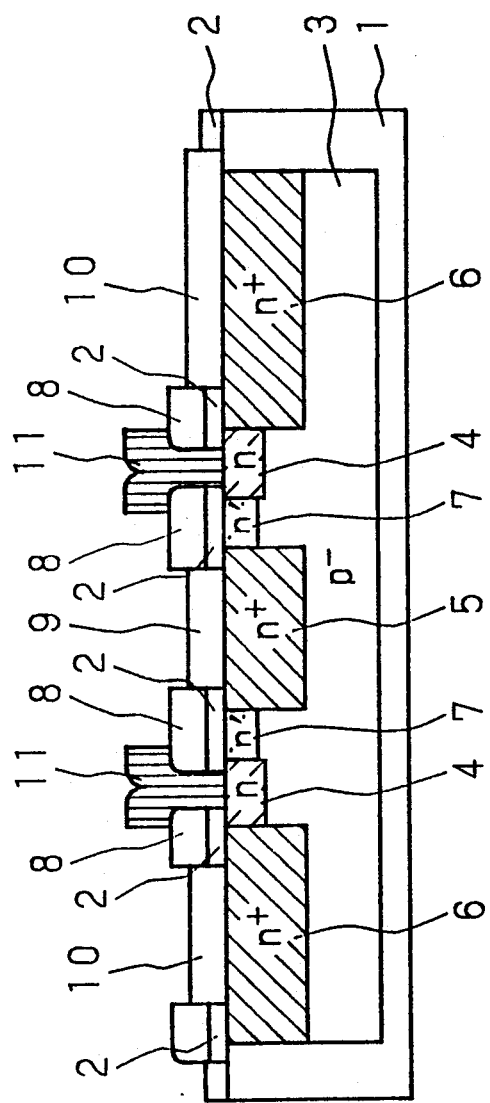
FIG. 5b is a cross section of the embodiment of FIG. 5a wherein a second channel layer has a depth less than a first channel layer.

After the resist 23 for forming the offset pattern is removed, as shown in FIG. 9(g), a dopant (Si) is implanted by additional ion implantation using the resist 22 as a mask, to form a channel layer 7 of n' conductivity type in contacting relationship with either side of the drain region 5, as shown in FIG. 10(a). The additional ion implantation of the dopant Si is performed at an implantation energy of 70 keV with an implant dose of $2 \times 10^{12}/cm^2$. The thickness of the channel layer 7 is chosen to be equal to or smaller than that of the channel layer 4 as shown in FIG. 5b.

Figure 11:
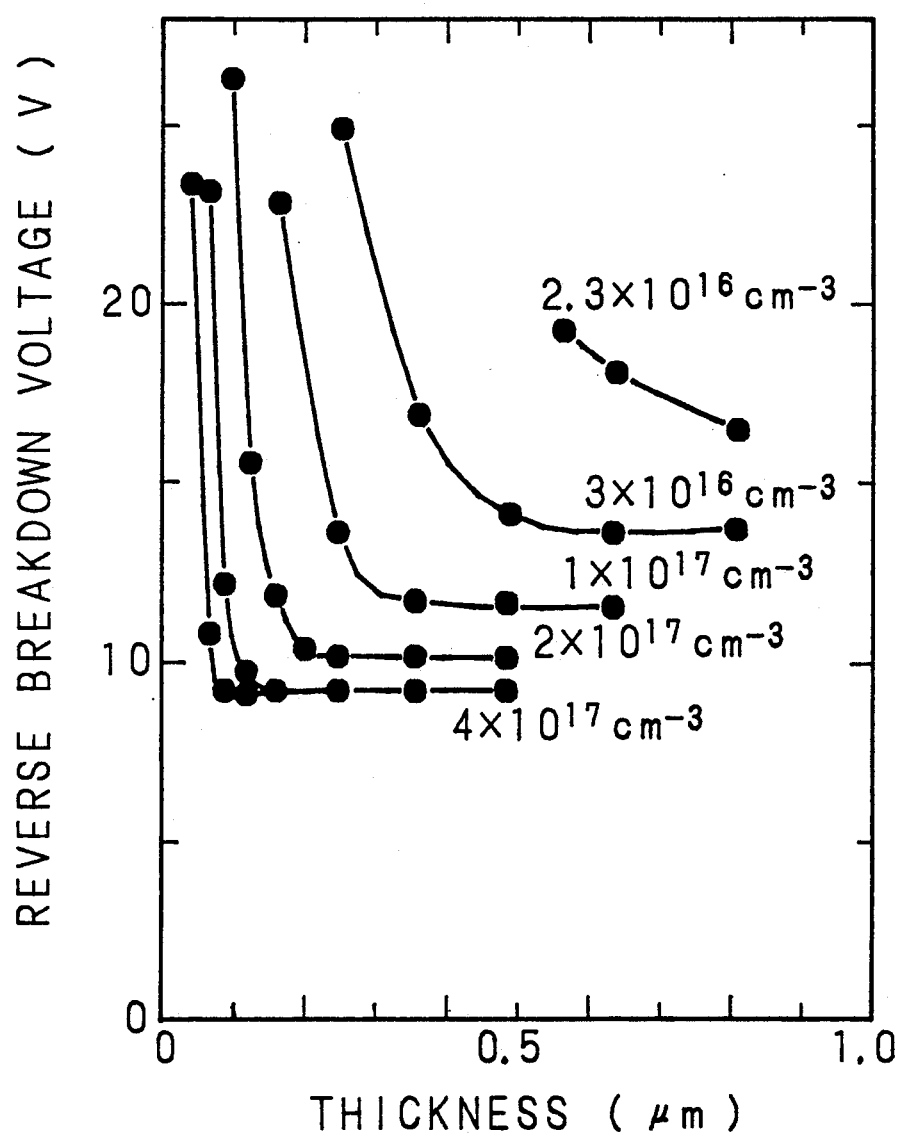
FIG. 11 is a graph showing the relationship between channel layer thickness and reverse breakdown voltage, with carrier concentration as a parameter.

FIG. 11 is a graph showing the relationship between the reverse breakdown voltage and the thickness of the n'-type channel layer 7, with the carrier concentration as a parameter. The thickness (μm) of the n'-type channel layer 7 is plotted along the abscissa and the reverse breakdown voltage (V) along the ordinate. As can be seen from the graph, the ion implant dose needed to form the desired channel layer 7 can be determined by first determining the required reverse breakdown voltage (V) and the thickness (μm) of the channel layer 7; therefore, the channel layer 7 of the desired implant amount can be formed by additionally implanting the amount of Si that matches the difference in carrier concentration between the channel layers 4 and 7.

Next, as shown in FIG. 10(b), using an oxygen plasma etching technique, the resist for dummy gate 22 is narrowed from the original width of 1.3 (μm) down to about 0.9 (μm), the resulting resist 22' being substantially centered on the channel layer 4. Then, using an electron cyclotron resonance plasma chemical vapor deposition process (ECR plasma CVD process), a SiO$_2$ film 8 of thickness about 2500 Å is deposited, as shown in FIG. 10(c), over the entire surface of the SiN film 2b including the narrowed resist 22'. As shown in FIG. 10(d), the resist 22' is lifted off to expose the SiN film 2b. In this situation, lamp annealing is performed for about five seconds at 850° C. in an N$_2$ atmosphere. After the annealing, the drain region 5 and source region 6 each have a thickness of 0.2 μm and a carrier concentration of $2 \times 10^{18}/cm^3$, the channel layer 4 has a thickness of 0.15 μm and a carrier concentration of $1 \times 10^{17}/cm^3$, and the channel layer 7 has a thickness of 0.15 μm and a carrier concentration of $2 \times 10^{17}/cm^3$.

Next, as shown in FIG. 10(e), the SiN film 2b and SiO$_2$ film 8 are etched away over the areas of the drain region 5 and source region 6, thereby exposing the surfaces of the drain region 5 and source region 6 on which a drain electrode 9 and a source electrode 10 made of Au/Ge alloy or the like are respectively formed. After that, as shown in FIG. 10(f), the SiN film 2b is etched away over the channel layer 4 to expose the surface thereof, and a gate electrode 11 of Ti, Al or the like is formed in contacting relationship with the exposed channel layer 4.

Embodiment 2

Figure 12A:
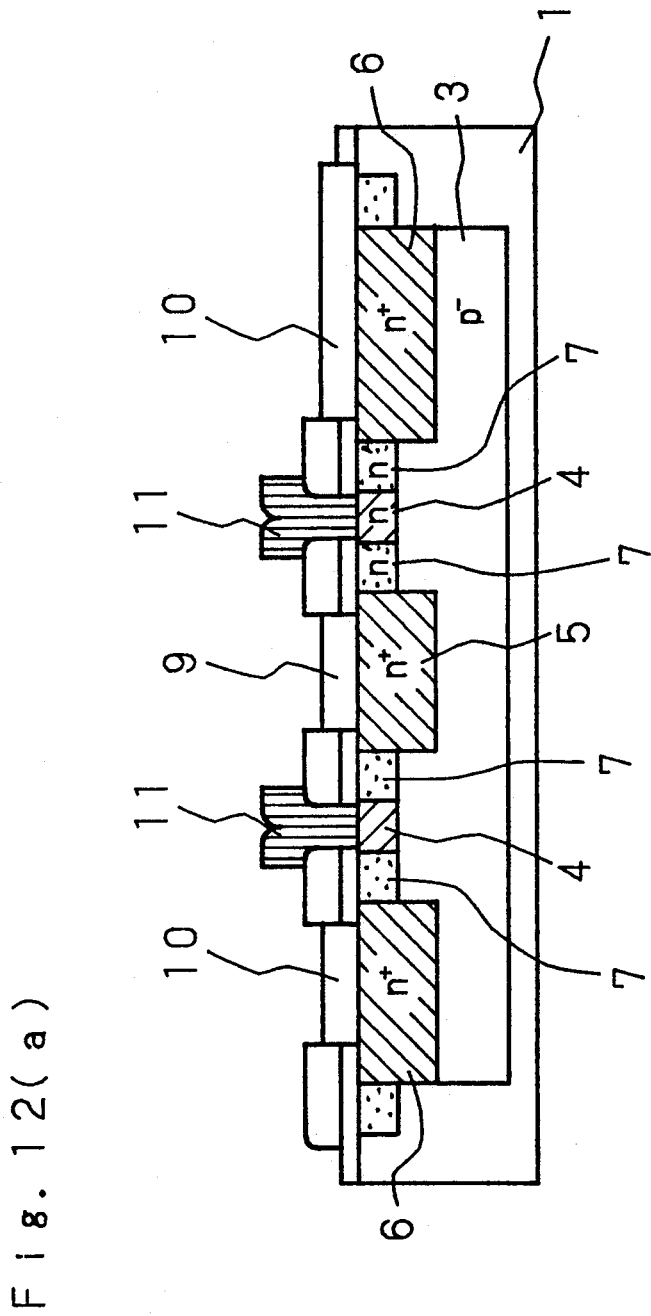
FIG. 12a is a cross sectional view of a field-effect transistor according to another embodiment of the present invention.

FIG. 12a is a cross sectional view of a field-effect transistor according to another embodiment of the present invention. A major difference between this embodiment and the first embodiment is that the channel layer 4 is flanked by two channel layers of n' conductivity type, 7 and 7, one between the channel layer 4 and the drain region 5 and the other between the channel layer 4 and the source region 6. The drain region of n+ conductivity type (high-impurity concentration active layer forming the drain) 5 and the source region of the same n+ conductivity type (high-impurity concentration active layer forming the source) 6, separated from each other by a prescribed distance, are formed to a prescribed depth from the surface of the GaAs substrate 1 and within the buffer layer 3 of p− conductivity type. The channel layer 4 of n conductivity type is formed substantially centered between the drain region 5 and the source region 6, the channel layer 7, 7 being flanked by the two channel layers of n' conductivity type, 7 and 7, respectively extending to the drain region 5 and source region 6. The channel layers 7, 7 are formed to the same depth as the channel layer 4 from the surface of the GaAs substrate 1.

The carrier concentration in the channel layers 7, 7 is chosen to be higher than that in the channel layer 4 but lower than that in the drain and source regions 5 and 6. The thickness W of the channel layers 7, 7 is the same as that for the first embodiment. Except with the above described difference, the structure of the second embodiment is essentially the same as that of the first embodiment. Therefore, the same reference numerals are used to indicate the corresponding parts and descriptions of those parts are omitted hereinafter.

Next, a method of fabricating a field-effect transistor having the above structure will be described with reference to FIGS. 13 and 14 illustrating a fabrication process sequence for the same. The processing steps shown in FIGS. 13(a) to 13(d) are essentially the same as those shown in FIGS. 9(a) to 9(d).

Figure 13A:
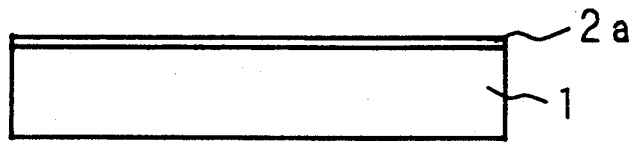
Figure 13B:
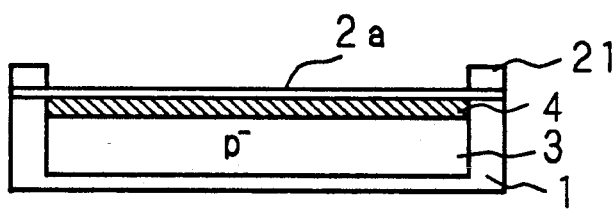
Figure 13C:
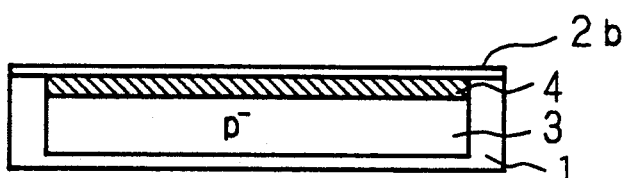
Figure 13D:
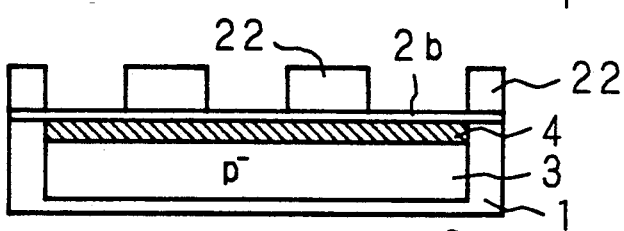
Figure 13E:
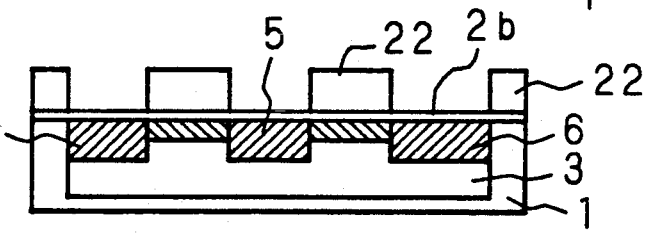
Figure 13F:
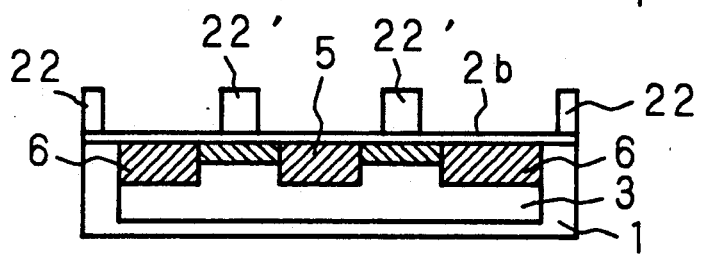

After removing the resist 21 and the SiN film 2a, as shown in FIG. 13(c), a SiN film 2b of 500 Å thickness that can withstand annealing is formed again over the surface of the GaAs substrate 1, and then, a resist 22 applied over the SiN film 2b for forming a dummy gate is patterned as shown in FIG. 13(d). Using the resist 22 as a mask, Si is implanted into a prescribed depth below the surface of the GaAs substrate 1 by ion implantation, thereby forming an ion-implanted drain region of n+ conductivity type (a high-impurity concentration active layer forming the drain) 5 and a source region of the same n+ conductivity type (a high-impurity concentration active layer forming the source) 6, as shown in FIG. 13(e). The spacing between the drain region 5 and the source region 6 is about 2 $\mu$m. As shown in FIG. 13(f), the resist 22 is then etched evenly from both sides thereof to narrow the original width of 2.0 $\mu$m down to about 0.9 $\mu$m, the resulting resist 22' being substantially centered between the drain region 5 and the source region 6.

Next, as shown in FIG. 14(a), Si is implanted by additional ion implantation, using the resist 22' as a mask, to form channel layers of n' conductivity type, 7 and 7, in contacting relationship with the channel layer 4 and the drain region 5 or the source region 6. After that, using an oxygen plasma etching technique, the resist 22' is etched evenly from both sides thereof to further narrow the width of 0.9 $\mu$m down to about 0.5 $\mu$m, thereby forming a resist 22" substantially centered with respect to the width of the channel layer 4, as shown in FIG. 14(b). Then, using an ECR plasma CVD process, a SiO$_2$ film 8 of thickness about 2500 Å is formed over the entire surface of the SiN film 2b including the narrowed resist 22", as shown in FIG. 14(c).

As shown in FIG. 14(d), the resist 22" is lifted off to expose the SiN film 2b. In this situation, lamp annealing is performed for about five seconds at 850° C. in an N$_2$ atmosphere. After the annealing, the drain region 5 and source region 6 each have a thickness of 0.2 $\mu$m and a carrier concentration of $2\times10^{18}$/cm$^3$, the channel layer 4 has a thickness of 0.15 $\mu$m and a carrier concentration of $1\times10^{17}$/cm$^3$, and the channel layers 7 each have a thickness of 0.15 $\mu$m and a carrier concentration of $2\times10^{17}$/cm$^3$. Next, as shown in FIG. 14(e), the SiN film 2b and SiO$_2$ film 8 are etched away over the areas of the drain region 5 and source region 6, thereby exposing the surfaces of the drain region 5 and source region 6 on which a drain electrode 9 and a source electrode 10 made of Au/Ge alloy or the like are respectively formed. After that, as shown in FIG. 14(f), the SiN film 2b is etched away over the channel layer 4 to expose the surface thereof, and a gate electrode 11 of Ti, Al or the like is formed in contacting relationship with the exposed channel layer 4.

Figure 12B:
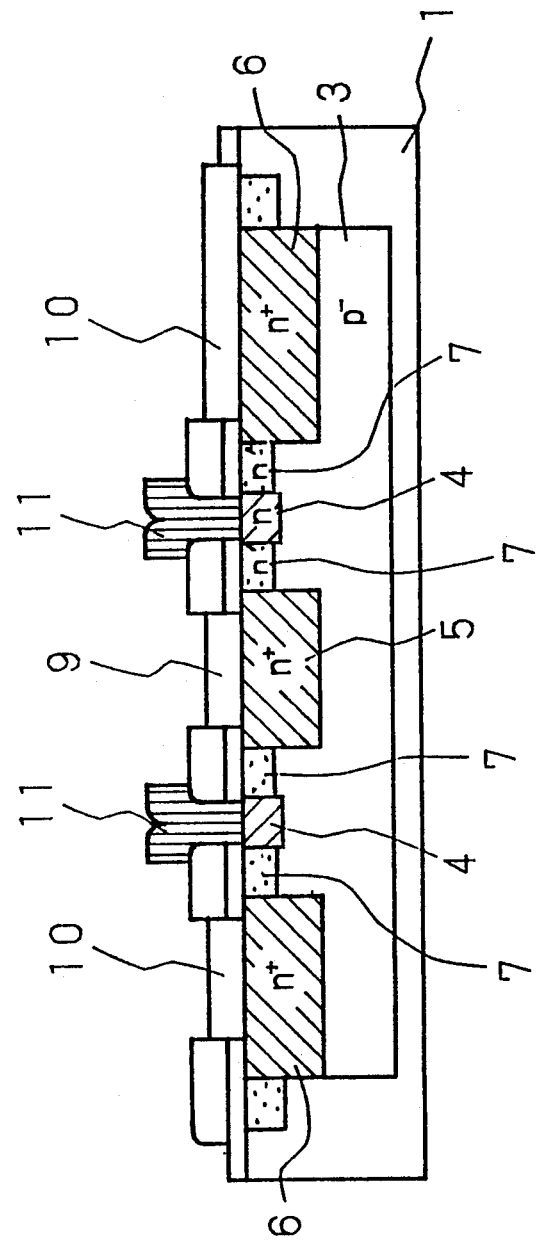
FIG. 12b is a cross section of the embodiment of FIG. 12a wherein second channel layers have a depth less than a first channel layer.

The second embodiment described above has dealt with the structure in which the thickness of the channel layers 7, 7 is made equal to that of the channel layer 4, but it will be appreciated that the thickness of the channel layers 7, 7 may be made smaller than that of the channel layer 4 as shown in FIG. 12b.

Embodiment 3

The third embodiment of the invention will now be described with reference to FIG. 15 illustrating a fabrication process sequence for the same. First, as shown in FIG. 15(a), a SiN film 2a through which to implant ions is formed over the surface of a semiconductive GaAs substrate 1. Ions are implanted through the SiN film 2a into the GaAs substrate 1 to form a channel layer 4 of n conductivity type to a prescribed depth. Next, a resist 22 is applied to a thickness of about 1 $\mu$m over the surface of SiN film 2a, and is patterned by exposure to light followed by development, thereby forming a dummy gate 22a as shown in FIG. 15(b). The dummy gate 22a centered on the surface is approximately 1 $\mu$m in width.

Figure 15A:
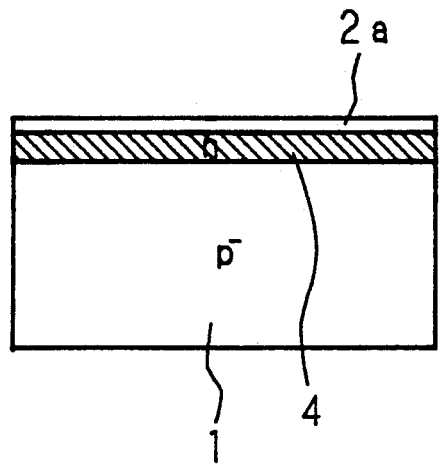
FIGS. 15(a) to 15(f) shows cross sectional views illustrating a fabrication process sequence according to one embodiment of the field-effect transistor fabrication method of the present invention.
Figure 15B:
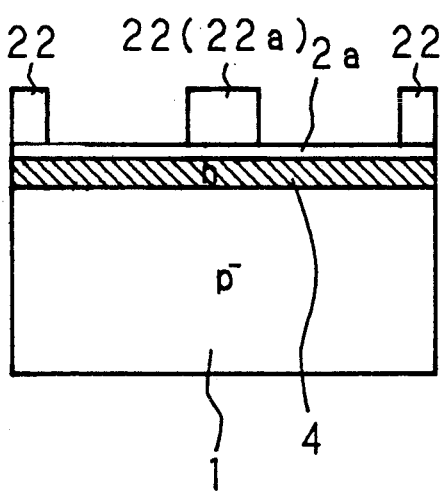
Figure 15C:
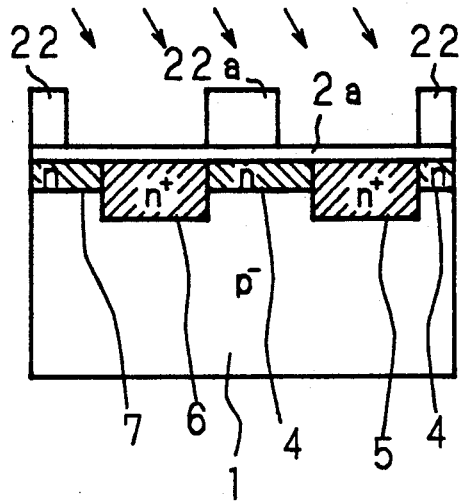
Figure 15D:
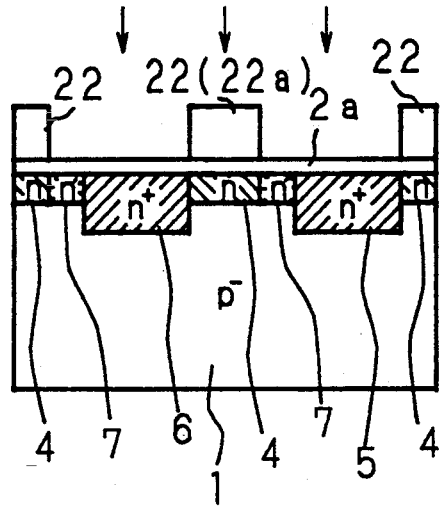

Using the resist 22 (including the dummy gate 22a) as a mask, ion implantation is performed from above the SiN film 2a at an angle of 60° relative to the surface thereof, as shown in FIG. 15(c), to form a drain region 5 and a source region 6, both of n+ conductivity type, in areas of the GaAs substrate 1 not covered or shadowed by the resist 22, to a greater depth below the surface of the GaAs substrate 1 than the channel layer 4. The spacing between the drain region 5 and the source region 6 is approximately 1.5 $\mu$m. Next, using the same resist 22 (including the dummy gate 22a) as a mask, ion implantation is performed perpendicularly to the surface of the SiN film 2a, to change a portion of the channel layer 4 into a channel layer 7 of n' conductivity type. The channel layer 7 is approximately 0.5 $\mu$m in width.

Figure 15E:
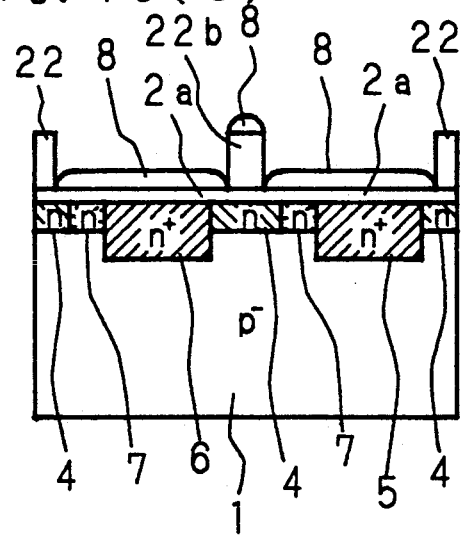
Figure 15F:
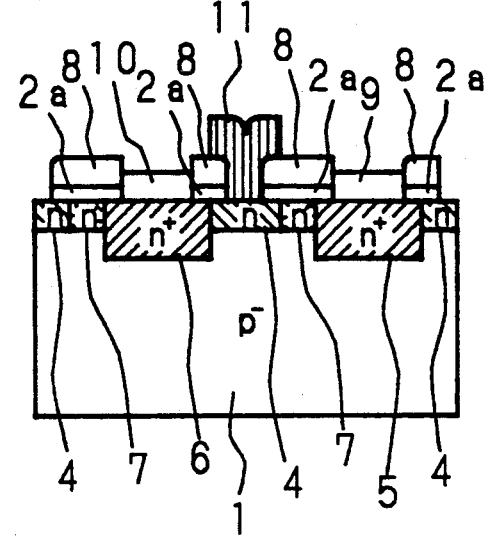

Next, using an oxygen plasma etching technique, for example, the dummy gate 22a of about 1 $\mu$m in width is narrowed down to a width of about 0.5 $\mu$m to form a dummy gate 22b as shown in FIG. 15(e); then, using an ECR plasma CVD process, a SiO$_2$ film 8 is deposited over the entire surface. After the resist 22 (including the dummy gate 22b) is lifted off using acetone, annealing is performed. The SiN film 2a acts as a cap during the annealing. Next, as shown in FIG. 15(f), the SiO$_2$ film 8 and the SiN film 2a are etched away over the areas of the drain region 5 and source region 6, thereby exposing the surfaces of the drain region 5 and source region 6 on which a drain electrode 9 and a source electrode 10 made of Au/Ge alloy or the like are respectively formed. After that, the SiN film 2a is etched away over the channel layer 4 to expose the surface thereof, and a gate electrode 11 is formed in contacting relationship with the exposed channel layer 4. The materials used for forming the layers and films, the ion implant conditions, the etching conditions, the annealing conditions, etc. used in this embodiment are essentially the same as those used in the first embodiment.

Figure 16:
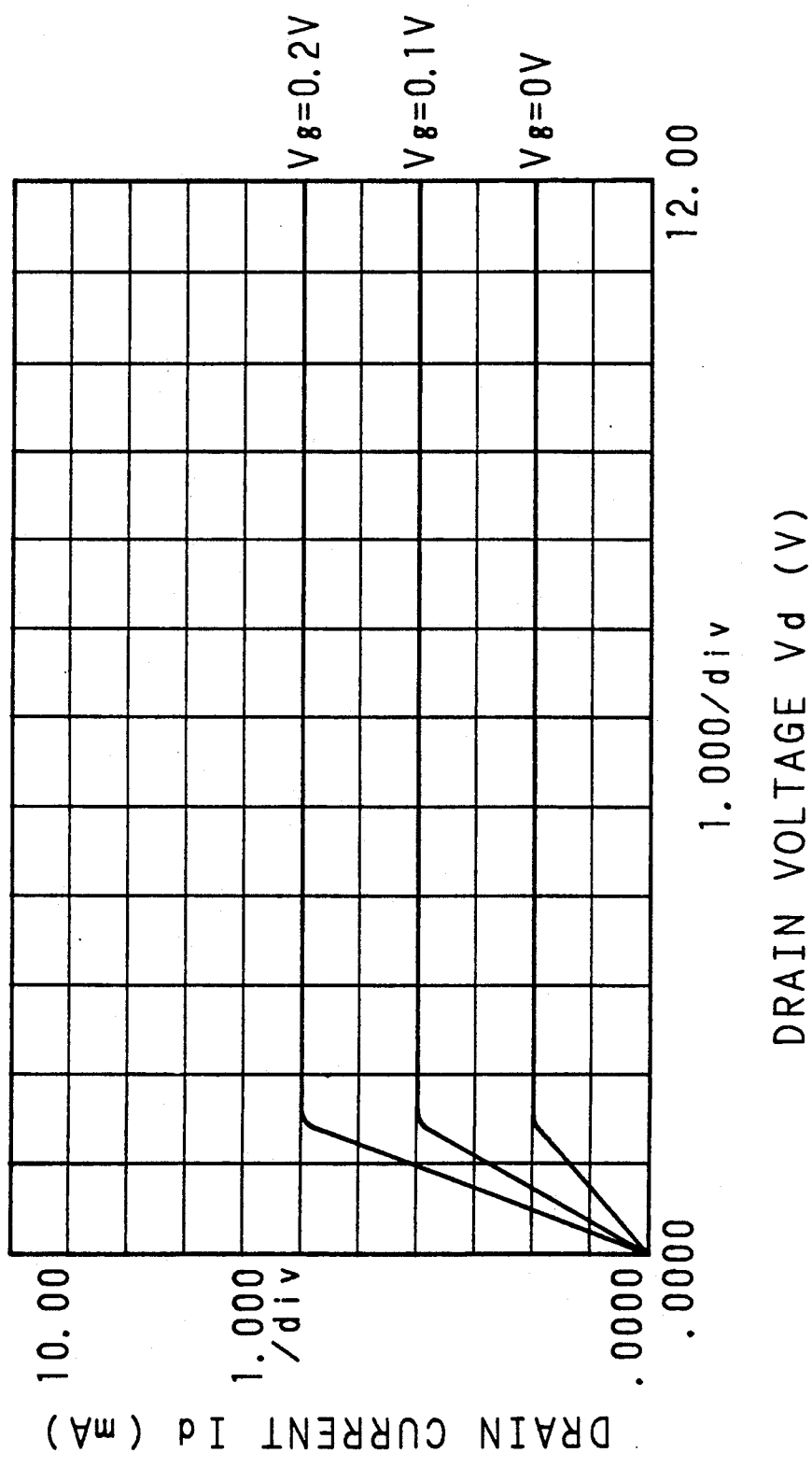
FIG. 16 is a graph showing the characteristics of the field-effect transistor fabricated in accordance with the method of FIGS. 15(a) to 15(f)

FIG. 16 is a graph showing the relationship between drain voltage (source-drain voltage) Vd and drain current (source-drain current) Id for the field-effect transistor fabricated in accordance with the above described method of the third embodiment. The drain voltage Vd (V) is plotted along the abscissa and the drain current Id (mA) along the ordinate. From the graph, it can be seen that even when the drain voltage is increased to 10 V or to a higher level, the drain current is maintained substantially constant, thus exhibiting an extremely good saturation characteristic.

Figure 17:
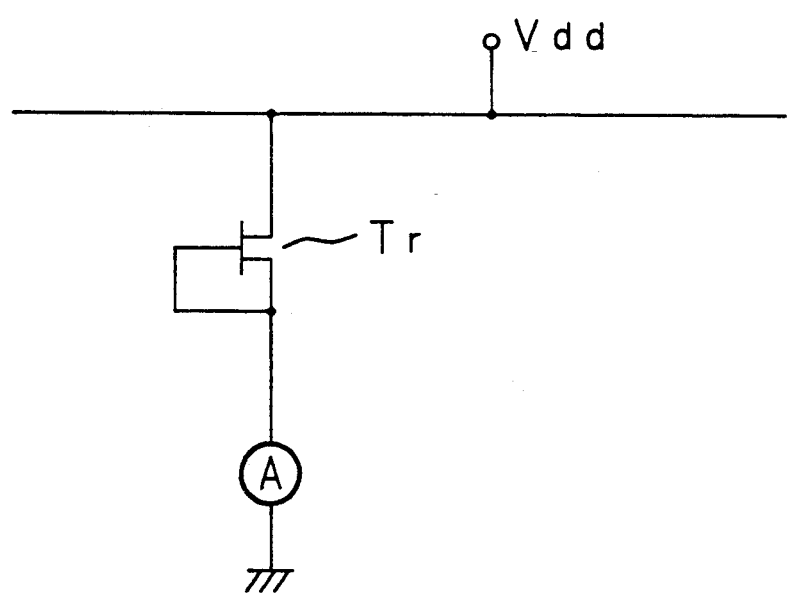
FIG. 17 is a schematic circuit diagram showing a mode of use of the field-effect transistor fabricated in accordance with the method of FIGS. 15(a) to 15(f)

When the field-effect transistor Tr having such characteristics is used in a circuit such as shown in FIG. 17, with the gate and source being shorted and grounded and a voltage Vdd applied to the drain, the voltage that can be applied to the source electrode and that is needed to flow a constant current to the source is in the range of 1.5 to 12 V, which allows connection of another device to the source electrode, easing circuit design constraints and providing flexibility to the circuit design.

Figure 18:
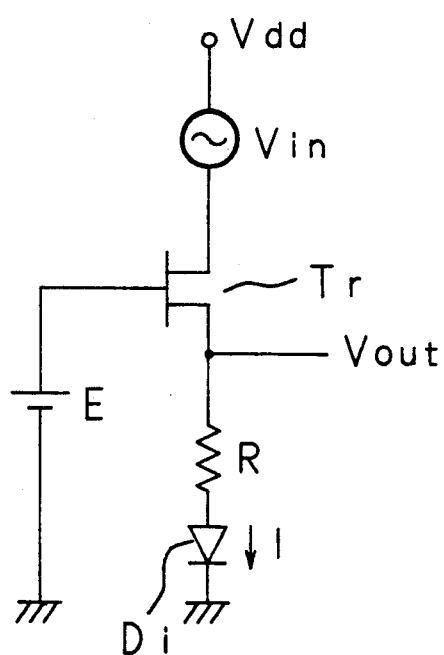
FIG. 18 is a schematic circuit diagram showing an example of application in which the field-effect transistor fabricated in accordance with the method of FIGS. 15(a) to 15(f) is used as a pulse generator.

FIG. 18 is a schematic circuit diagram of a pulse generator constructed with the field-effect transistor Tr fabricated in accordance with the method of the third embodiment. The positive terminal of power supply E is connected to the gate electrode to apply a positive bias voltage, and voltage Vdd is applied to the drain electrode. The source electrode is grounded via a resistor R and a diode Di.

Figure 19A:
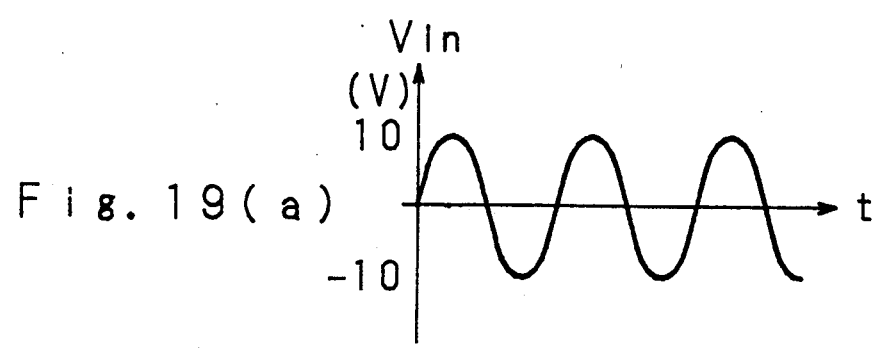
FIGS. 19(a) to 19(c) shows waveforms for the pulse generator of FIG. 18.
Figure 19B:
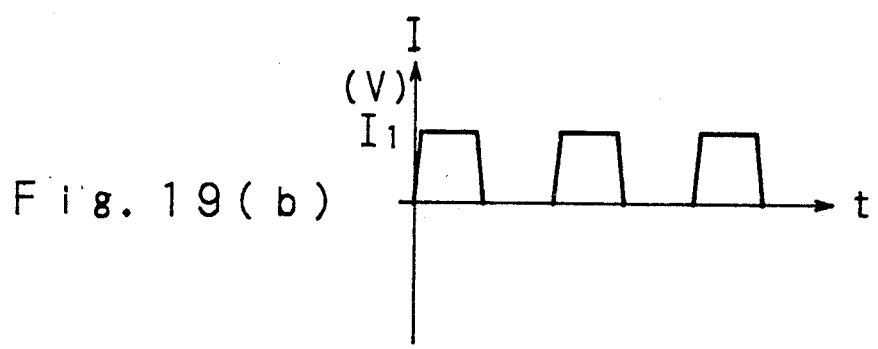
Figure 19C:
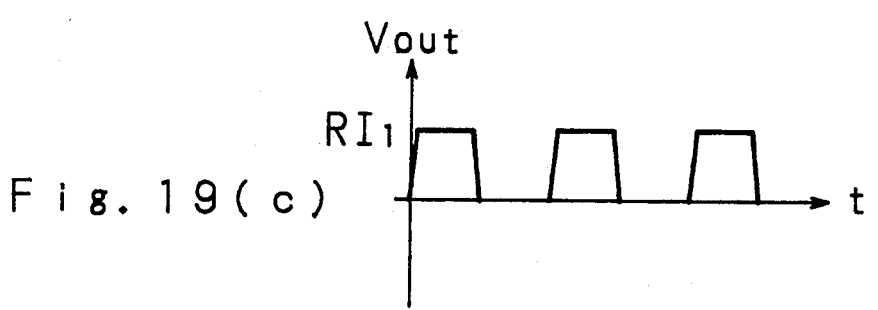

Let us now consider the situation in which an input signal represented by a sinusoidal wave as shown in FIG. 19(a) is applied to the drain electrode. Since the current flowing in the field-effect transistor Tr is constant over the voltage range of 1.5 to 12 V, as described above, the constant current can be maintained if the input signal amplitude is inside of the 12 V limit. For example, if the input signal is a sinusoidal wave of peak amplitude of 10 V, a constant current I1 as shown in FIG. 19(b) is allowed to flow over the voltage range of 1.5 to 10 V. When a voltage exceeding this range is applied, the current drops to almost zero. When the value R·I1 is reduced, the source potential becomes almost zero as the voltage drop across the resistor R is small, and the output voltage as shown in FIG. 19(c) is produced. FIG. 19(c) is a waveform chart plotting the time t along the abscissa and the output voltage Vout along the ordinate. As shown, a series of well-defined pulses is obtained.

As described, according to the third embodiment, since ion implantation is performed from two different angles, i.e. obliquely and perpendicularly to the substrate surface, allowing successive formation of the n+-type drain and source regions 5, 6 and the n'-type channel layer 7, the embodiment has the advantage of simplifying the fabrication process.

Embodiment 4

FIGS. 20 and 21 are cross sectional views illustrating a still further embodiment of the invention. As shown in FIG. 20(a), a SiN film 2a of 500 Å thickness is formed over the surface of a semiconductive GaAs substrate 1, which is followed by the application of a resist 21 over the surface of the SiN film 2a, the resist 21 then being patterned. Using the resist 21 as a mask, ion implantation is performed from above the surface of the SiN film 2a to form a channel layer 4 of n conductivity type. After removing the resist 21 and the SiN film 2a, preannealing is performed on the GaAs substrate 1. After that, a SiN film 2b is formed again, as shown in FIG. 20(b), on which a resist 22 is applied and patterned. Then, a resist 23 is applied covering everywhere including the resist 22 but excluding the area where a high-impurity concentration active layer 6' is to be formed. Through the SiN film 2b exposed in the area where the high-impurity concentration active layer 6' is to be formed, ions are implanted to form the high-impurity concentration active layer 6' of n+ conductivity type to a greater depth than the layer 4.

After the resist 23 is removed, oxygen plasma etching is performed on the resist 22 to reduce the width and thickness thereof, as shown in FIG. 20(c). After that, using an ECR plasma CVD process, a SiO$_2$ film 8 is formed over the entire surface including the surface of the resist 22, which is followed by the patterning of a resist 24 covering everywhere except the areas where the source and drain regions are to be formed. Next, as shown in FIG. 20(d), slight etching is performed to remove the portions of the SiO$_2$ film 8 that cover the sides of the resist 22; then, the resist 22 with its sides cleared of the SiO$_2$ film 8 is lifted off together with the resist 24. The resist 22, except in the areas where the source and drain regions are to be formed, remains unremoved, for example, in the area where a gate electrode is to be formed, as it is covered by the SiO$_2$ film 8. In this situation, ion implantation is performed from above the SiO$_2$ film 8 and SiN film 2b to form a channel layer 7 of n' conductivity type and a drain region 5 and source region 6 of n+ conductivity type to a prescribed depth below the surface of the GaAs substrate 1.

Figure 21A:
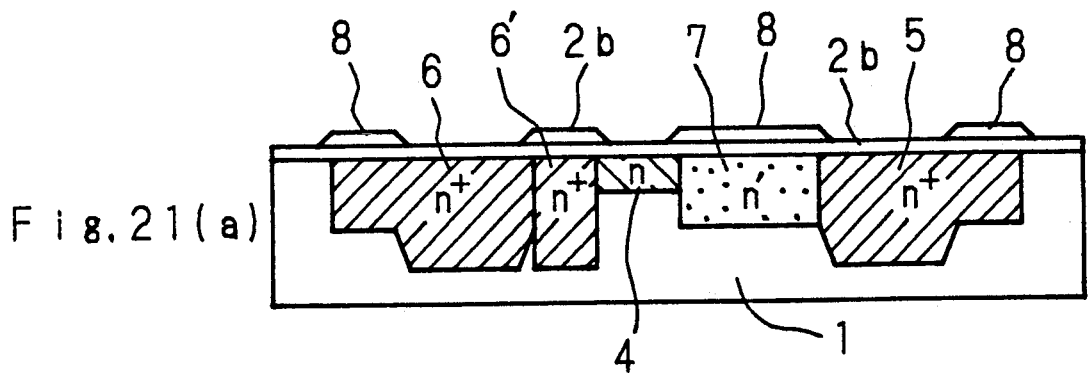
Figure 21B:
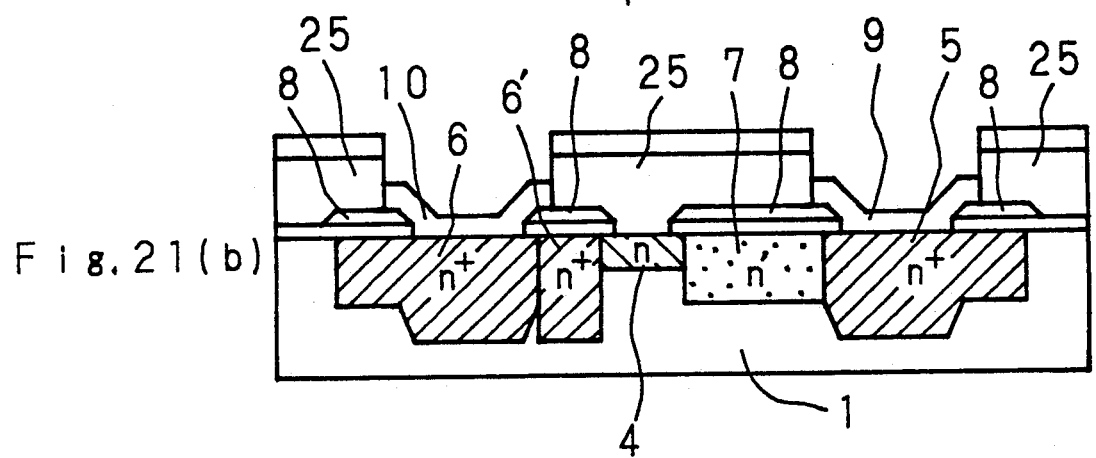

Next, in order to remove the remaining resist 22 covered by the SiO$_2$ film 8, slight etching is performed on the portions of the SiO$_2$ film 8 that cover the sides of the resist 22, and the remaining resist 22 is lifted off. As shown in FIG. 21(a), the SiN film 2b is now exposed in the areas where the source, drain, and gate electrodes are to be formed. After annealing for a short period of time, a resist 25 is applied and patterned leaving the source and drain electrode formation areas exposed, as shown in FIG. 10(b). An electrode material is deposited, which is then patterned to form a drain electrode 9 and a source electrode 10. After that, the resist 25 is lifted off.

Figure 21C:
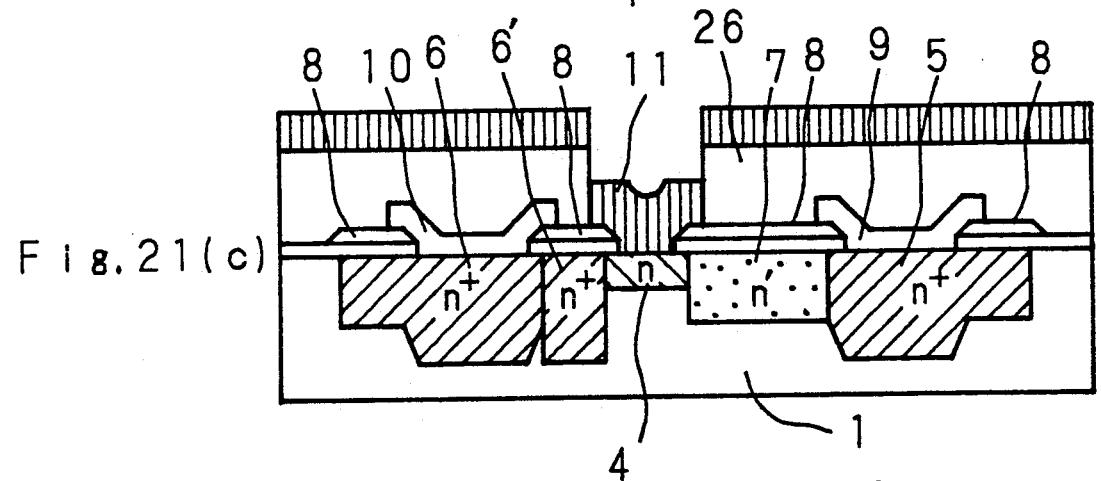
Figure 21D:
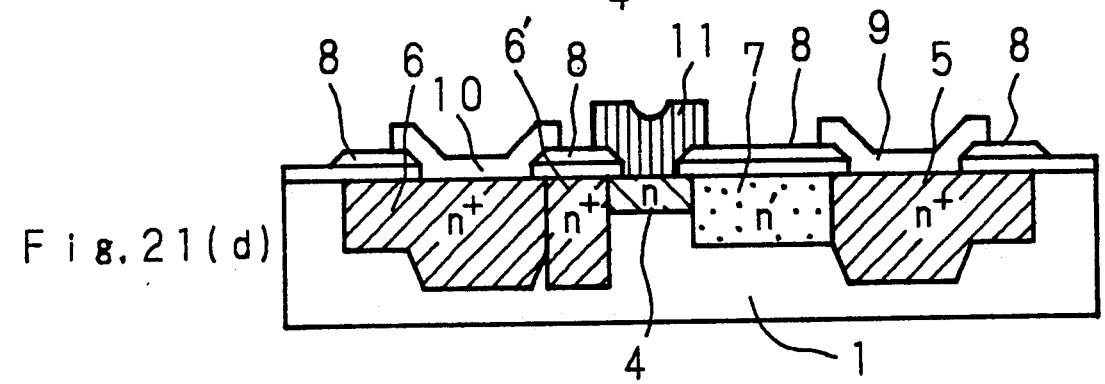

Further, as shown in FIG. 21(c), a resist 26 is patterned leaving the gate electrode formation area exposed, and an electrode material is deposited, which is then patterned to form a gate electrode 11. After that, the resist 26 is lifted off, as shown in FIG. 21(d), to complete the fabrication of a field-effect transistor.

According to the fourth embodiment, since the gate to source electrode spacing and the gate to drain electrode spacing can be controlled by the accuracy to which the resist 22 can be formed, uniformity in the field-effect transistor characteristics is enhanced. Furthermore, by combining the suitably patterned resists 22 and 23, it is possible to form the drain region 5, source region 6, and channel layer 7 in an efficient manner, which contributes to simplifying the fabrication process.

As this invention may be embodied in several forms without departing from the spirit of essential characteristics thereof, the present embodiments are therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims.

What is claimed is:

1. A field-effect transistor, comprising:
a semiconductor substrate;
a gate electrode;
a drain region of a first high carrier concentration of a first conductivity type;
said drain region being in said substrate;
a source region of a second high carrier concentration of a first conductivity type;
said source region being in said substrate;
a first channel layer, interposed between said drain region and said source region, contacting said gate electrode, and having a first carrier concentration of said first conductivity type;
a second channel layer interposed between said first channel layer and said drain region in a non-contacting relationship with said gate electrode and having a second carrier concentration of said first conductivity type higher than said first carrier concentration of said first channel layer;
said first channel layer having a thickness W1;
said second channel layer having a thickness W2 satifying the expression $$W2 \leq (\epsilon_r \epsilon_0 E_a)/(q \cdot N)$$

where
$\epsilon_r$ = relative permitivity of said second channel layer,
$\epsilon_0$ = permitivity of free space,
$E_a$ = critical field strength at said second channel layer,
q = unit charge of electron,
N = carrier concentration of said second channel layer,
W2 < W1.

2. A field-effect transistor, comprising:
a gate electrode;
a semiconductor substrate;
a drain region of a first high carrier concentration of a first conductivity type;
said drain region being in said substrate;
a source region of a second high carrier concentration of a first conductivity type;
said source region being in said substrate;
a first channel layer, interposed between said source and said drain regions, in a contacting relationship with said gate electrode, said gate electrode having a position being nearer to said source region than to said drain region; and
a second channel layer, interposed between said first channel layer and said drain region, in a non-contacting relationship with said gate electrode and having a carrier concentration higher than that in said first channel layer;
said first channel layer having a thicknes W1; and
said second channel layer having a thickness W2 satisfying the expression $$W2 \leq (\epsilon_r \epsilon_0 E_a)/(q \cdot N)$$

where
$\epsilon_r$ = relative permitivity of said second channel layer,
$\epsilon_0$ = permitivity of free space,
$E_a$ = critical field strength at said second channel layer,
q = unit charge of electron,
N = carrier concentration of said second channel layer,
W2 < W1.

3. A field-effect transistor, comprising:
a semiconductor substrate;
a gate electrode;
a drain region of a first high carrier concentration of a first conductivity type;
said drain region being in said substrate;
a source region of a second high carrier concentration of a first conductivity type;
said source region being in said substrate;
a first channel layer, interposed between said drain region and said source region, contacting said gate electrode, and having a first carrier concentration of said first conductivity type;
second channel layers including one of said second channel layers being interposed between said first channel layer and said drain region, and another of said second channel layers being interposed between said first channel layer and said source region;
said second channel layers being in a non-contacting relationship with said gate electrode and having a second carrier concentration of said first conductivity type higher than said first carrier concentration of said first channel layer; and
said second channel layers each having a thickness W2 satisfying the expression $$W2 \leq (\epsilon_r \epsilon_0 E_a)/(q \cdot N)$$

where
$\epsilon_r$ = relative permitivity of said second channel layer
$\epsilon_0$ = permitivity of free space
$E_a$ = critical field strength at said second channel layer
q = unit charge of electron
N = carrier concentration of said second channel layer.

4. A field-effect transistor as set forth in claim 3, wherein said second carrier concentration in said second channel layers is lower than said first and second high carrier concentrations of said drain and source regions.

5. A field-effect transistor as set forth in claim 3, comprising said first channel layer having a thickness W1 where W2≦W1.

6. A field-effect transistor as set forth in claim 3, wherein a distance between said gate electrode and said drain region is substantially equal to the distance between said gate electrode and said source region.

7. A field-effect transistor, comprising:
a semiconductor substrate;
a gate electrode;
a drain region of a first high carrier concentration of a first conductivity type;
said drain region being in said substrate;
a source region of a second high carrier concentration of a first conductivity type;
said source region being in said substrate;
a first channel layer, interposed between said drain region and said source region, contacting said gate electrode, and having a first carrier concentration of said first conductivity type;
a second channel layers interposed between said first channel layer and said drain region, and said first channel layer and said source region;
said second channel layers being in a non-contacting relationship with said gate electrode and having a second carrier concentration of said first conductivity type higher than said first carrier concentration of said first channel layer;
said second carrier concentration being less than said first and said second high carrier concentrations of said source and said drain regions;
said first channel layer having a thickness W1;
said second channel layers each having a thickness W2 satisfying the expression $$W2 \leq (\epsilon_r \epsilon_0 \cdot E_a)/(q \cdot N)$$

where
$\epsilon_r$=relative permitivity of said second channel layer,
$\epsilon_0$=permitivity of free space,
$E_a$=critical field strength at said second channel layer,
q=unit charge of electron,
N=carrier concentration of said second channel layer,
W2≦W1;
and
said gate electrode being positioned substantially equidistant from said source and said drain region.

8. A field-effect transistor as set forth in claim 7, wherein said semiconductor substrate comprises gallium arsenide.

9. A field-effect transistor as set forth in claim 7, comprising:
first insulating layers formed of a SiN film;
second insulating layers formed of a SiO$_2$ film; and
said first and second insulating layers separating said gate electrode from each of said second channel layer, said drain region, and said source region.

10. A field-effect transistor as set forth in claim 1, wherein said semiconductor substrate comprises gallium arsenide.

11. A field-effect transistor as set forth in claim 1, comprising:
first insulating layers formed of a SiN film;
second insulating layers formed of a SiO$_2$ film; and
said first and second insulating layers separating said gate electrode from each of said second channel layer, said drain region, and said source region.

12. A field-effect transistor as set forth in claim 3, wherein said semiconductor substrate comprises gallium arsenide.

13. A field-effect transistor as set forth in claim 3, comprising:
first insulating layers formed of a SiN film;
second insulating layers formed of a SiO$_2$ film; and
said first and second insulating layers separating said gate electrode from each of said second channel layer, said drain region, and said source region.

* * * * *